United States Patent [19]
Anderson et al.

[11] Patent Number: 5,974,680
[45] Date of Patent: Nov. 2, 1999

[54] APPARATUS FOR USE IN CLEANING WAFERS

[75] Inventors: Gary L. Anderson, St. Ann, Mo.; Keith Wilson, El Cerrito, Calif.

[73] Assignee: MEMC Electronic Materials, Inc., St. Peters, Mo.

[21] Appl. No.: 08/917,206

[22] Filed: Aug. 22, 1997

Related U.S. Application Data

[63] Continuation of application No. 08/613,302, Mar. 11, 1996, abandoned.

[51] Int. Cl.$^6$ .................................................. F26B 17/24
[52] U.S. Cl. ................................................. 34/58; 134/902
[58] Field of Search ................................. 34/58, 60, 61, 34/236, 573, 202, 238; 210/774; 134/902

[56] References Cited

U.S. PATENT DOCUMENTS

| | | | |
|---|---|---|---|
| 4,902,350 | 2/1990 | Steck | 134/1 |
| 4,941,489 | 7/1990 | Kamimura et al. | 134/95 |
| 4,989,345 | 2/1991 | Gill, Jr. | 34/58 |
| 4,997,490 | 3/1991 | Vetter et al. | 134/26 |
| 5,022,419 | 6/1991 | Thompson et al. | 134/902 X |
| 5,039,321 | 8/1991 | Satoh et al. | 55/259 |
| 5,081,733 | 1/1992 | Kudo | 15/77 |
| 5,129,955 | 7/1992 | Tanaka | 134/2 |
| 5,174,045 | 12/1992 | Thompson et al. | 34/58 |
| 5,186,192 | 2/1993 | Netsu et al. | 134/68 |
| 5,232,328 | 8/1993 | Owczarz et al. | 414/222 |
| 5,277,715 | 1/1994 | Cathey | 134/2 |
| 5,282,289 | 2/1994 | Hasegawa et al. | 15/21.1 |
| 5,313,966 | 5/1994 | Sadamori | 134/76 |
| 5,317,778 | 6/1994 | Kudo et al. | 15/88.3 |
| 5,327,921 | 7/1994 | Mokuo et al. | 134/182 |
| 5,331,987 | 7/1994 | Hayashi et al. | 134/102.1 |
| 5,339,539 | 8/1994 | Shiraishi et al. | 34/58 |
| 5,341,825 | 8/1994 | Kobayashi et al. | 134/61 |
| 5,421,905 | 6/1995 | Ueno et al. | 134/25.4 |
| 5,427,644 | 6/1995 | Nagatsuka et al. | 156/344 |
| 5,435,075 | 7/1995 | Shiraishi et al. | 34/58 |
| 5,468,302 | 11/1995 | Theitje | 134/1 |
| 5,671,764 | 9/1997 | Murakami et al. | 134/200 |

FOREIGN PATENT DOCUMENTS

| | | |
|---|---|---|
| 269997 | 11/1987 | European Pat. Off. . |
| 03124030 | 5/1991 | Japan . |
| WO 92/07376 | 4/1992 | WIPO . |

*Primary Examiner*—Henry Bennett
*Assistant Examiner*—Steve Gravini
*Attorney, Agent, or Firm*—Senniger, Powers, Leavitt & Roedel

[57] ABSTRACT

A semiconductor wafer scrubbing and drying apparatus is capable processing wafers in a vertical orientation from start to finish. The apparatus moves the wafers in a generally vertical direction from an entry station of the apparatus to a dryer of the apparatus. The wafers enter the apparatus in a cassette and exit in another cassette in the same order as they were in the entry cassette to preserve individual wafer identity. The apparatus is constructed so that the compartment in which the wafers are handled is isolated and the components handling the wafers in that compartment are made of a fluorinated plastic. The actuators driving the motion of the wafer handling components are located in another compartment. A rinsing device in the wafer handling compartment is activated and deactivate for rinsing one of the wafers without the use of valves in the rinse line.

24 Claims, 18 Drawing Sheets

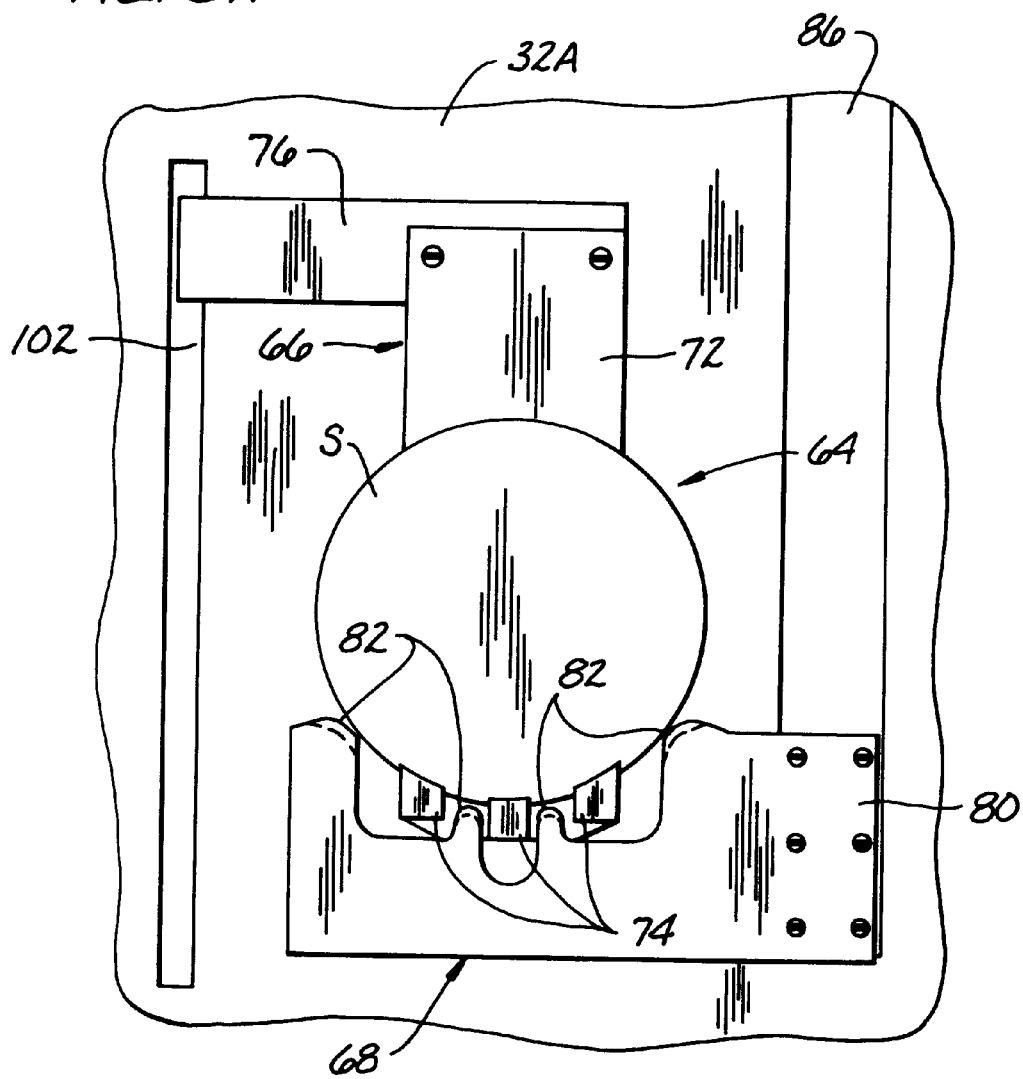

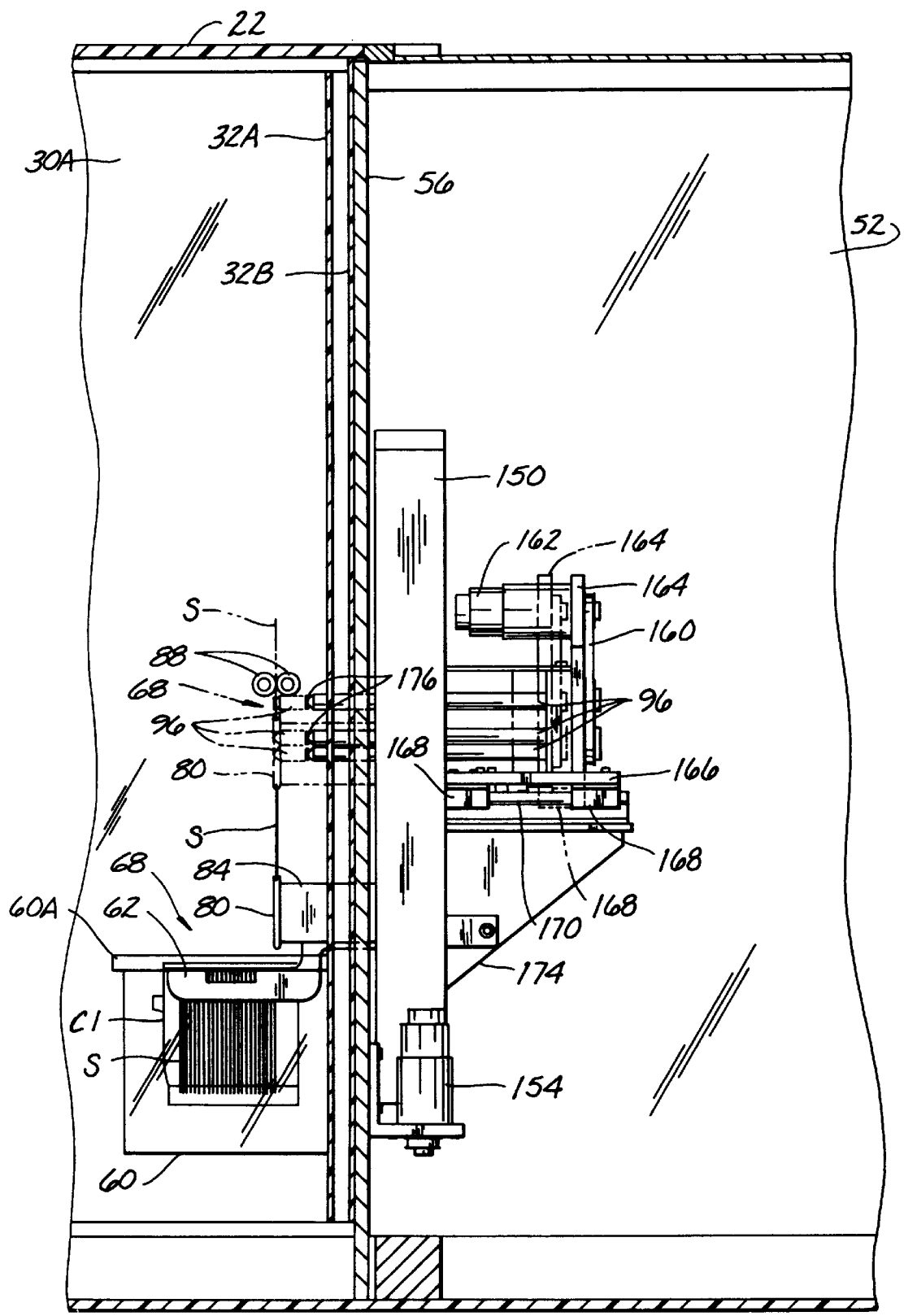

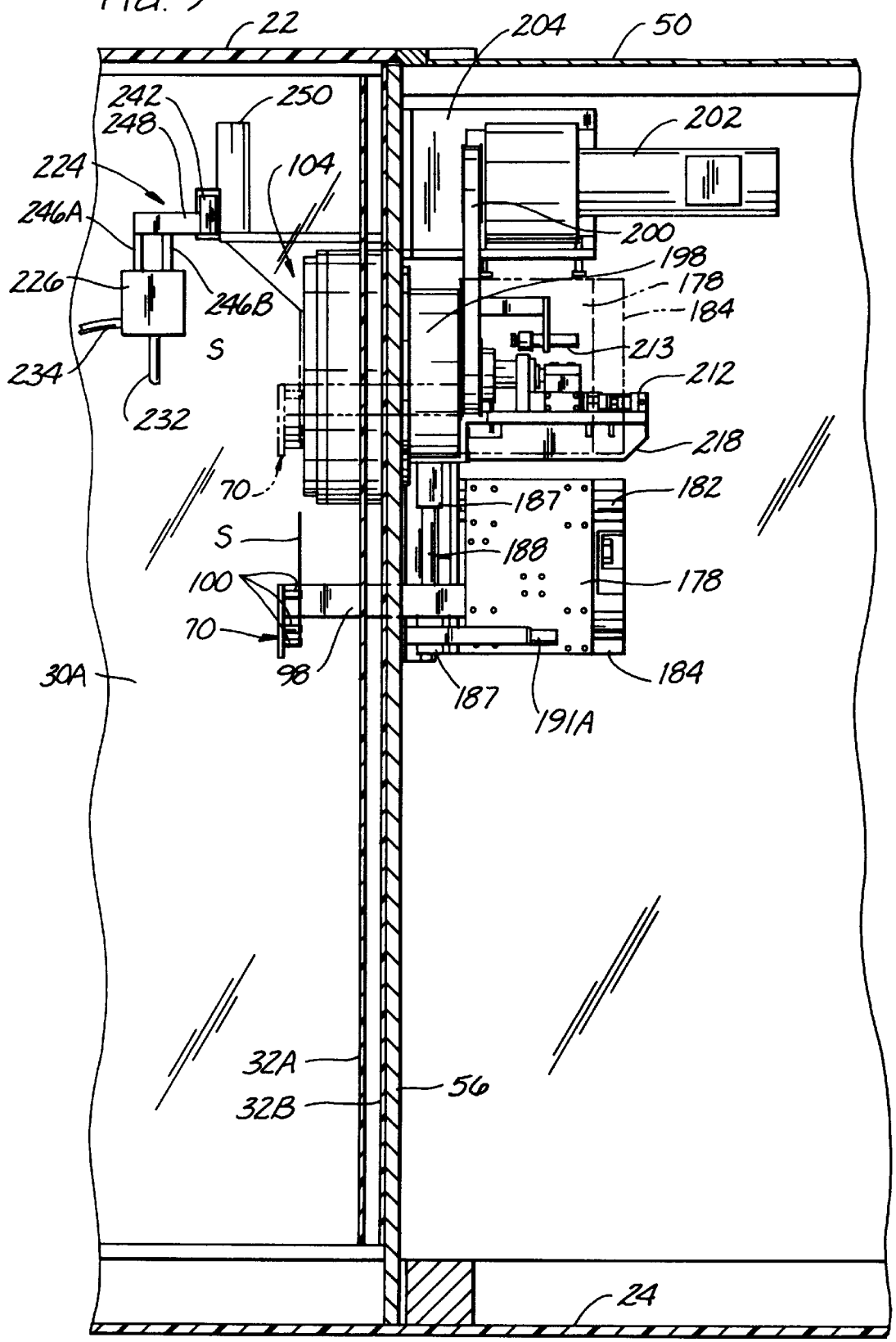

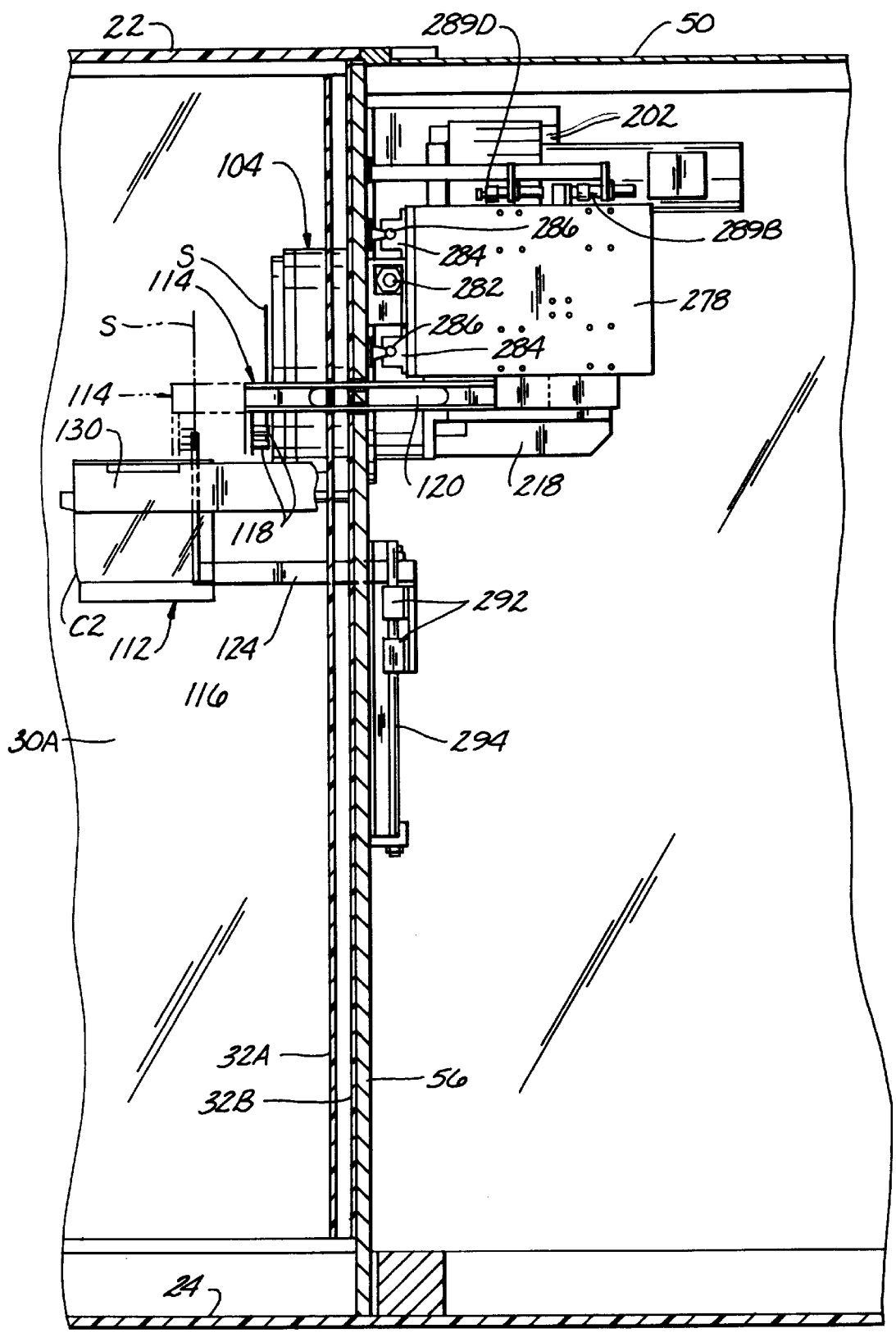

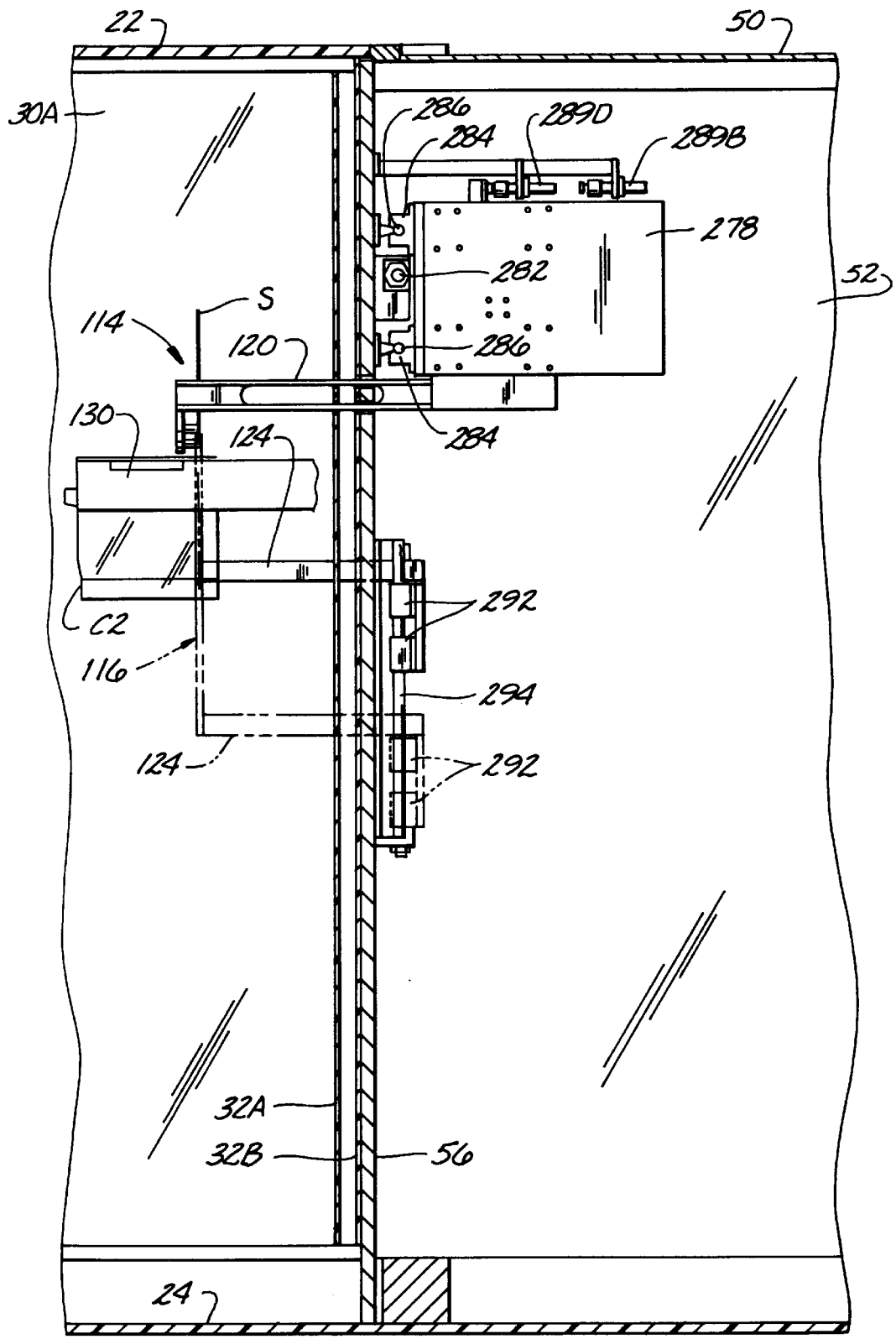

APPARATUS FOR USE IN CLEANING WAFERS

This application is a continuation of application Ser. No. 08/613302, filed Mar. 11, 1996.

BACKGROUND OF THE INVENTION

This invention relates generally to apparatus for use in cleaning semiconductor wafers and more particularly to apparatus for use in cleaning wafers which protects the wafers from particle contamination during the cleaning process.

As is known, contaminates on the surface of a semiconductor wafer will adversely affect the electrical properties of the wafer. Therefore, it is of the utmost importance that the wafer surface be substantially free of particulate and other contaminates. Thus, at least the final stage of semiconductor wafer manufacture involves cleaning the wafer to remove the contaminates. Many methods are available for cleaning the wafers, including both chemical and mechanical processes as well as ultrasonic processes. Even with mechanical cleaning some liquids are used to facilitate the process. Therefore, it is always necessary to dry the wafers once cleaned.

The exacting standards of cleanliness required in the semiconductor industry (e.g., no more than 10 particles on the wafer greater than 0.2 micrometers in diameter) create unique problems for wafer cleaning. For example, the cleaning process itself can cause contaminates to deposit on the wafer surface as the wafer is handled. The conventional automated cleaning method processes wafers in a horizontal position. A wafer transport which holds the wafer as it is cleaned typically comprises a vacuum chuck or O-ring belt which engages one face of the wafer. Heretofore, the motors, belts, bearings and other mechanical parts used to clean the wafers were in close proximity to the wafer itself. These parts are sources of particulate and metallic contamination of the wafers in the cleaning apparatus. Moreover, the horizontal orientation of the wafers presents a large surface area perpendicular to the direction of flow of air through the cleaning apparatus. Thus, the surface is more likely to capture particles entrained in the air flow.

There are presently some vertical cleaning apparatus such as shown by Kudo et al., U.S. Pat. No. 5,317,778. However, the Kudo et al. apparatus receives wafers in a horizontal orientation and then moves them to a vertical orientation. As a result grippers having opposing members must be used to grip the wafers on opposing sides for moving them to a vertically upright position. The greater the area of the wafer contacted by the gripper member, the greater the chance for contamination of the wafer. Moreover, Kudo et al. rely upon infrared drying which evaporates liquid from the surface of the wafer. Evaporative drying leaves behind on the wafer contaminants which were suspended or dissolved in the wafer cleaning or rinsing liquids.

SUMMARY OF THE INVENTION

Among the several objects and features of the present invention may be noted the provision of apparatus for use in cleaning wafers which protects the wafers from particulate contamination; the provision of such apparatus which isolates the wafers from mechanical components of the apparatus; the provision of such apparatus in which the wafers are handled in a vertically upright position; the provision of such apparatus which holds the wafers so that only a thin profile is perpendicular to the air flow through the apparatus; the provision of such apparatus in which contact with the wafers for holding them is made only along a lower edge of the wafer; the provision of such apparatus including a dryer which rapidly removes liquid from the wafer for drying without chemical aid or control of the air pressure in the dryer; the provision of such apparatus which facilitates tracking of individual wafers.

Generally, apparatus for use in automatically cleaning semiconductor wafers includes a wafer entry station for receiving wafers held in a vertical orientation, and a first wafer transfer means for transferring one wafer at a time from the wafer entry station without changing the vertical orientation of said one wafer. A spin dryer constructed for receiving said one wafer from said first wafer transfer means and holding said one wafer in a vertical orientation is rotatable about an axis passing generally through the center of said one wafer received from said first wafer transfer means at a rate of rotation selected to throw liquid on said one wafer off of the wafer. A second wafer transfer means for transferring said one wafer from the spin dryer in a vertical orientation to a wafer exit station receives said one wafer from said second wafer transfer means in a vertical orientation.

In another aspect of the present invention, a method for drying a semiconductor wafer in an automatic drying machine generally comprises the steps of placing a plurality of vertically upright wafers in a wafer entry station of the drying machine. Each of said plurality of wafers is lifted vertically out of the wafer entry station and transported in a vertical upright orientation to a dryer of the drying machine. The wafers are each spun in the vertically upright orientation in a spin dryer of the drying machine to remove liquid from the wafer. Thereafter, each wafer is transported in the vertically upright orientation from the spin dryer to a wafer exit station.

Other objects and features of the present invention will be in part apparent and in part pointed out hereinafter.

BRIEF DESCRIPTION OF THE DRAWINGS

FIG. 6A is an enlarged fragmentary front elevational view taken from FIG. 2 illustrating transfer of a wafer from the wafer picker to the first wafer transport;

FIG. 7 is a cross sectional view of the apparatus similar to FIG. 6 but with the wafer picker removed and a wafer scrubber of the apparatus additionally illustrated;

FIG. 9 is a cross sectional view similar to FIG. 4, but further enlarged and fragmented with parts of the apparatus other than the second wafer transport and a wafer dryer of the apparatus removed;

FIG. 12 is a fragmentary cross sectional view similar to FIG. 5 but further enlarged and fragmented with parts of the apparatus other than the wafer dryer, the wafer take-off transport, a wafer placer and a wafer exit station of the apparatus removed;

FIG. 13 is a cross sectional view similar to FIG. 12 but with the wafer dryer and the wafer take-off transport removed and illustrating placement of the wafer in a cassette at a wafer exit station of the apparatus;

Corresponding reference characters indicate corresponding parts throughout the several views of the drawings.

DETAILED DESCRIPTION OF THE DRAWINGS

Figure 1:
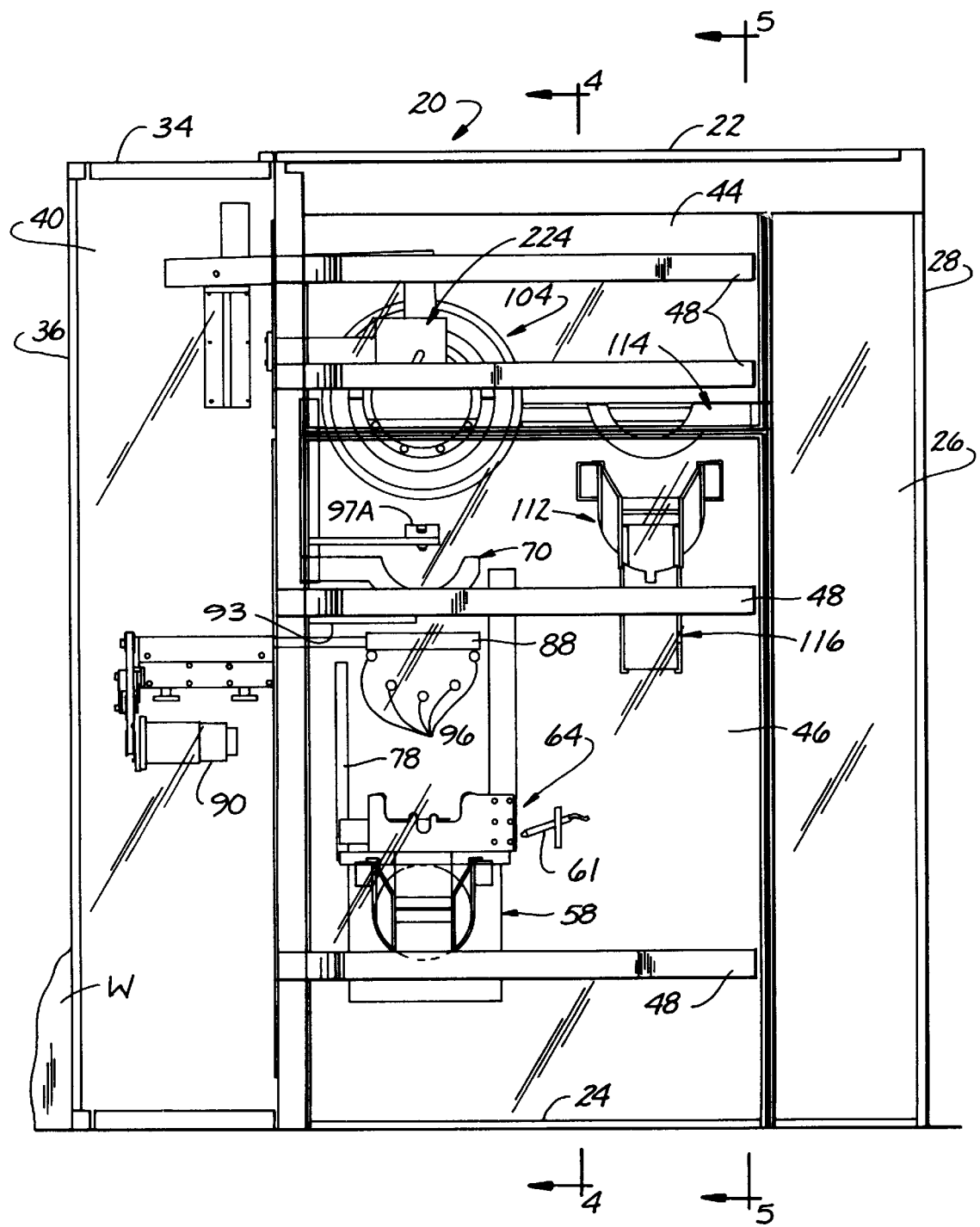
FIG. 1 is a front elevational view of wafer cleaning and drying apparatus of the present invention.
Figure 2:
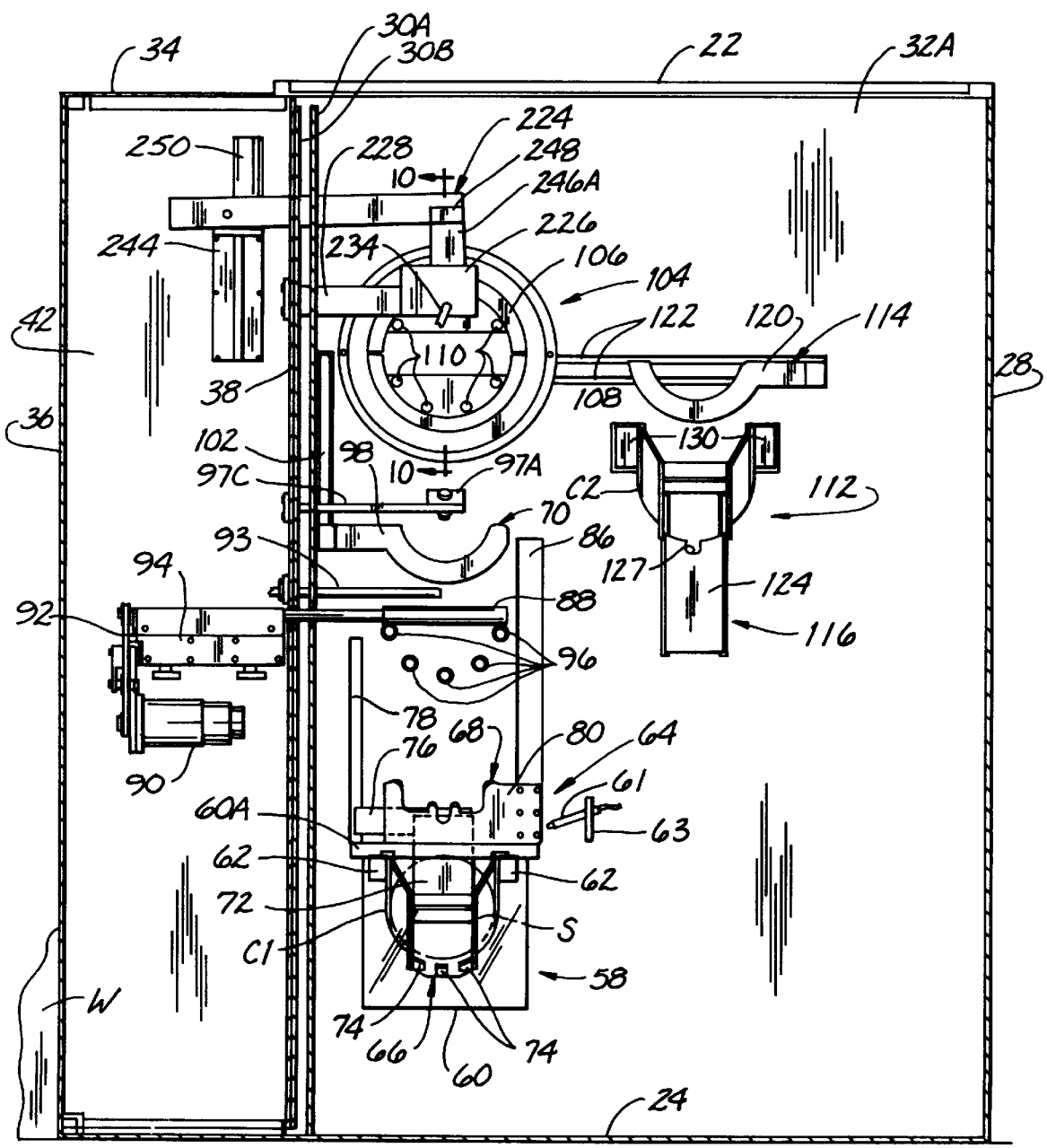
FIG. 2 is a front elevational view with the front of transparent housing of the apparatus removed to more clearly show the arrangement of wafer handling components of the apparatus.
Figure 3:
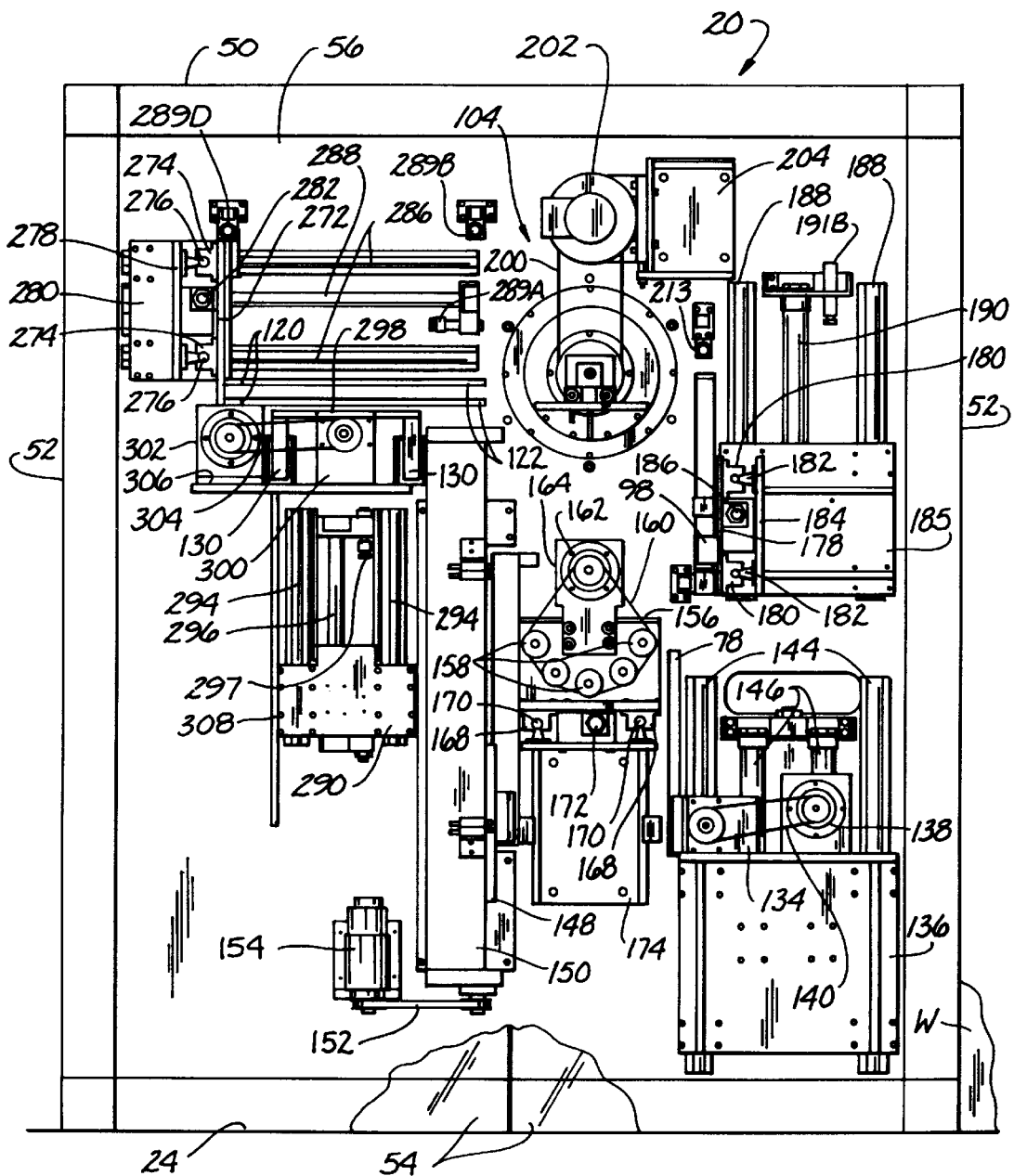
FIG. 3 is a back elevational view of the apparatus with the housing broken away to show mechanical components of the apparatus.
Figure 4:
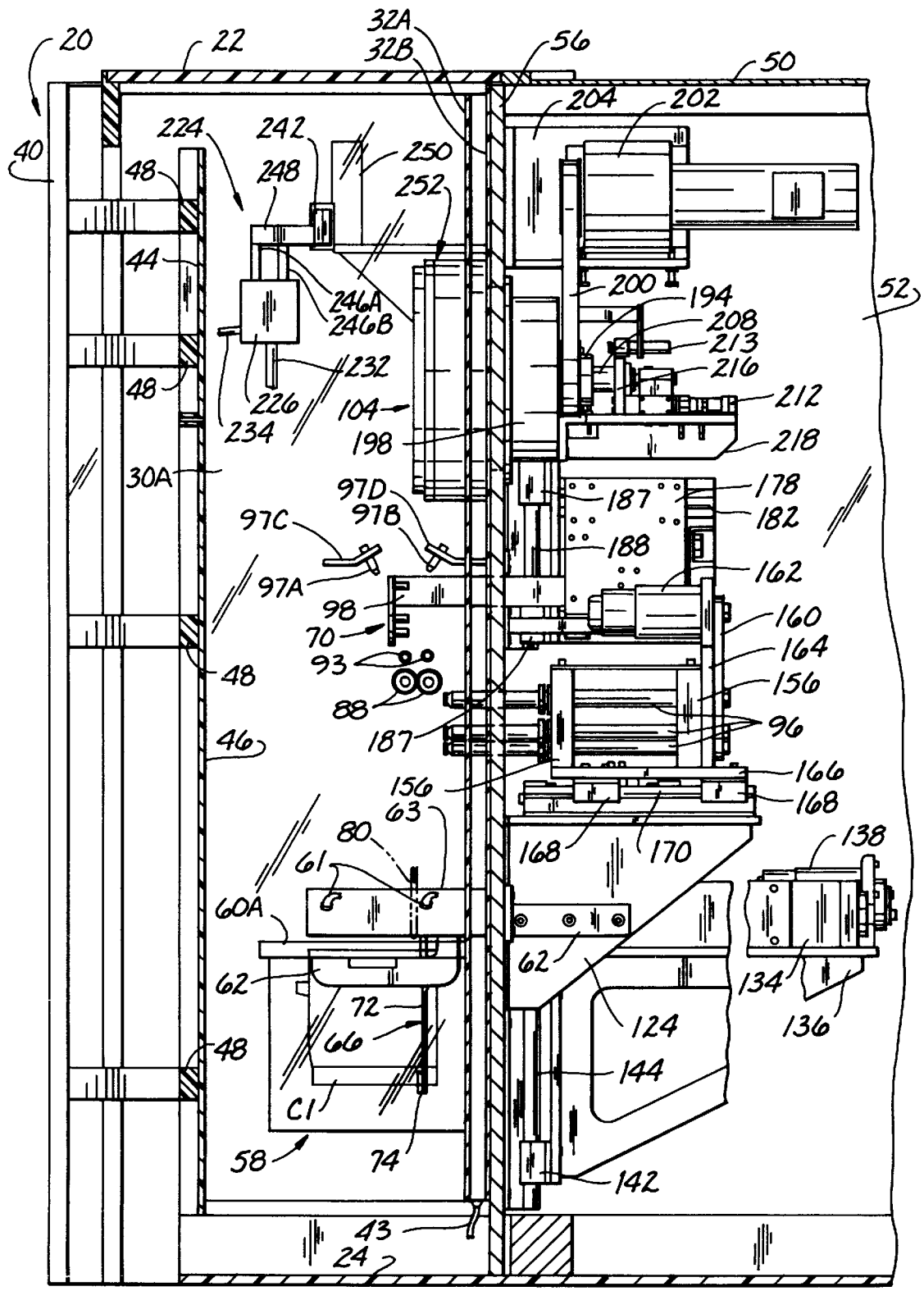
FIG. 4 is an enlarged, fragmentary cross sectional view of the apparatus taken in the plane including line 4—4 of FIG. 1 and showing a first wafer transport arm in phantom with the remainder of the first wafer transport removed.

Referring now to the drawings, and in particular to FIGS. 1–3, apparatus for use in cleaning semiconductor wafers is shown to comprise a housing, generally indicated at 20, substantially enclosing a volume to be isolated. The housing extends through a wall W between a clean room, which is the vantage from which FIG. 1 is seen, and a service room, which is the vantage from which FIG. 3 is seen. Only fragmentary portions of the wall W through which the housing 20 extends are illustrated in the drawings. The portion of the housing in the clean room contains two compartments, inside the first of which semiconductor wafers are processed (i.e., cleaned and dried, or simply dried). The first compartment is defined in part by a top wall 22, a portion of a bottom wall 24 of the housing 20, a front wall 26, a right side wall 28, a double left side wall (including inner and outer panels 30A and 30B), and a double rear wall (FIG. 4) (including inner and outer panels 32A and 32B). The second compartment in the clean room is defined by a further extension of the bottom wall 24, a top wall 34, left and right side walls (designated 36 and 38, respectively) a front wall 40 and a back wall 42. The double walls 30, 32 separate the first compartment from the second compartment and a third compartment of the housing in which mechanical equipment for actuating wafer handling components in the first compartment is located. The space between the panels of each double wall 30, 32 is exhausted and drained. A drain 43 for draining the space between the inner and outer panels 32A, 32B of the rear double wall is shown in FIG. 4. A similar drain (not shown) drains the space between the inner and outer panels 30A, 30B of the left side double wall. The front wall 26 of the first compartment includes an upper door 44 and a lower door 46 mounted by respective pairs of polymeric brackets 48 connected to the housing for independently pivoting each door between open and a closed position.

The rear portion of the housing is a third compartment which as shown in FIG. 3 is defined by another extension of the bottom wall 24, a top wall 50, two side walls 52 and two side-by-side rear doors 54. Only fragmentary portions of the rear doors 54 are shown in FIG. 3, but they are pivotally mounted to respective side walls 52 of the third compartment for pivoting between opened and closed positions. In the closed position, the rear doors 54 cover the open back of the housing 20. The walls of the first, second and third compartments of the housing described thus far are made of a suitable transparent plastic (e.g., LEXAN). A front wall 56 of the third compartment adjacent to the rear double wall 32 of the first compartment is a sheet of aluminum approximately one inch thick upon which various actuating mechanisms of the apparatus (described hereinafter) are rigidly mounted.

Referring now particularly to FIG. 2, the apparatus is shown to comprise a wafer entry station, indicated generally at 58, for receiving wafers S (only one is shown, in phantom) held in a vertical orientation in a cassette C1. The wafer cassette C1 is conventional, contacting the wafers S only at a few discrete locations along their edges. The top and bottom of the cassette C1 are open, which as will be seen, facilitates automated removal and replacement of the wafers. The wafer entry station 58 further includes a transparent constant overflow tank 60 in which the cassette C1 is received and held between a pair of support arms 62 in the tank. In another embodiment (not shown) support arms are constructed for supporting the entry wafer cassette C1 from under the cassette. An advantage of support from the bottom is that wafer cassettes of different configurations are more readily held by the same support arms. Deionized water is constantly fed into the tank 60 and overflows into a trough 60A around the upper perimeter of the tank to keep the environment within the tank clean. The trough 60A is connected to drains (not shown) for removing the overflow water from the trough. A pair of nozzles 61 mounted by a bracket 63 are located up and to the right of the overflow tank 60 and spray water onto the surface of the water in the overflow tank to sweep water at the surface of the tank into the trough 60A for keeping the surface water clean.

First wafer transfer means for transferring one wafer at a time from the wafer entry station 58 for cleaning and drying or drying alone without changing the vertical orientation of the wafer is designated generally at 64. The first wafer transfer means includes a wafer picker and first and second wafer transports, designated generally by the reference numerals 66, 68 and 70 respectively. The wafer picker 66 includes an arm 72 and three spaced apart fingers 74 at the lower end of the arm. The upper end of the arm 72 is connected to a bracket 76 extending laterally to the left (as seen in FIG. 2) and rearwardly through a vertical slot 78 in the double rear wall 32 of the first compartment and front wall 56 of the third compartment of the housing where it connects to actuating means to be described hereinafter. The wafer picker 66 is capable of lifting one wafer S at a time out of the cassette C1 to a position above the cassette where the wafer is passed off from the wafer picker to the first wafer transport 68.

Figure 6:
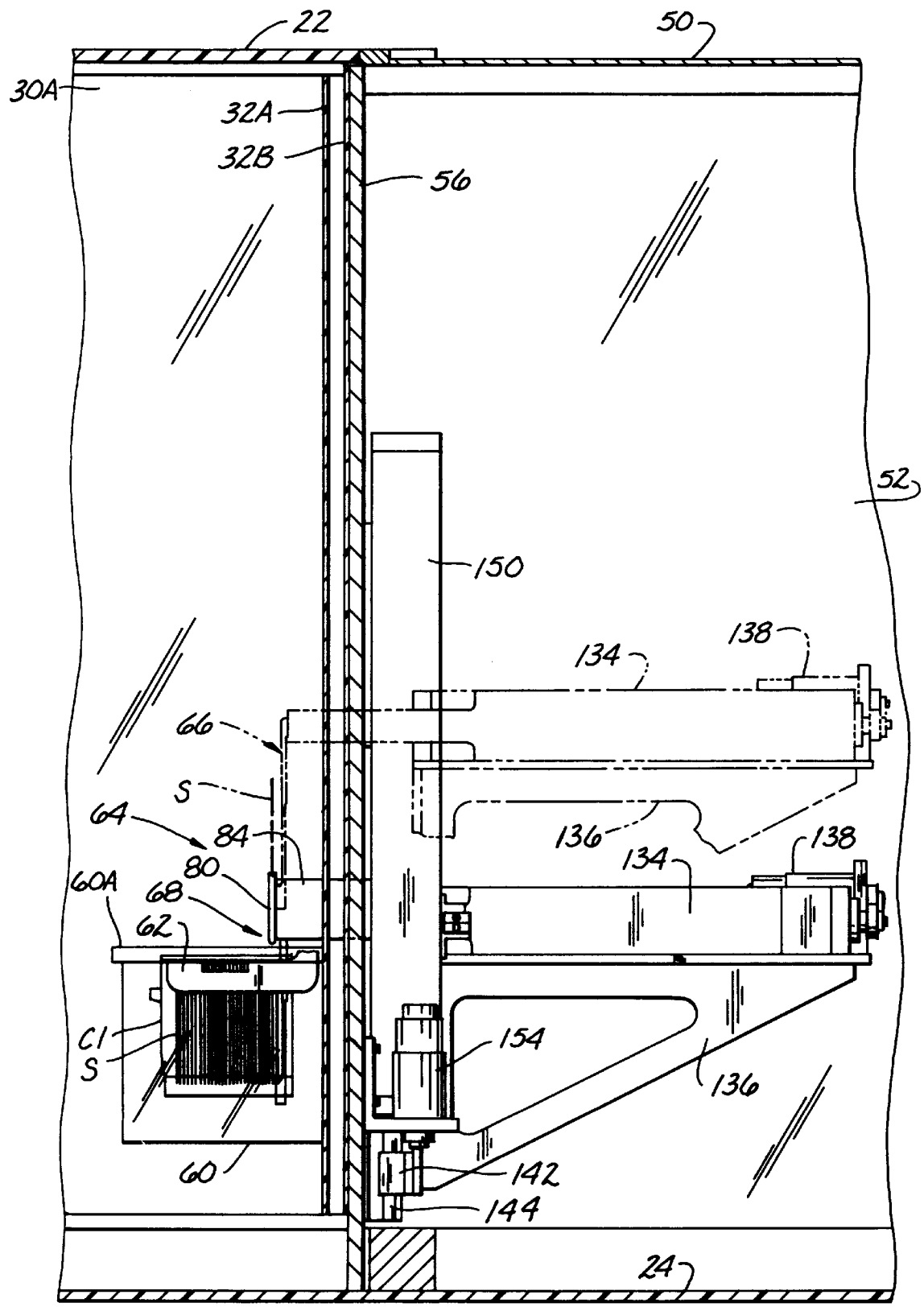
FIG. 6 is a cross sectional view similar to FIG. 5 but further enlarged and fragmented with parts of the apparatus other than a wafer entry station, wafer picker and the first wafer transport of the apparatus removed.

The first wafer transport 68 has an arm 80 formed with four spaced apart fingers 82 for holding the wafer S. The fingers 82 are offset from the fingers 74 of the wafer picker 66, which facilitates the passing off of the wafer S from the wafer picker to the first wafer transport 68 (FIG. 6A). The first wafer transport arm 80 is connected at its right end to a bar 84 (FIG. 6) extending through a vertical slot 86 in the rear double wall 32 of the first compartment and front wall 56 of the third compartment to other actuating means described in detail hereinafter. The first wafer transport 68 can be moved upward directly to the second wafer transport 70 if the wafer S is only to be dried, or intermediately to a pair of rotary wafer scrubber rollers 88 for cleaning the wafer.

The scrubber rollers 88 extend through the left side double wall 30 of the first compartment and the right side wall 38 of the second compartment where they are connected to an electric motor 90 by a belt 92. The motor 90 is mounted by a bracket 94 to the right side wall 38 of the second compartment and may be selectively energized for conjointly rotating the scrubber rollers 88 about their longitudinal axes. Cleaning solution lines 93 drip a cleaning liquid (e.g., ammonium hydroxide) onto each of the scrubber rollers 88. Although the motor 90 and bracket 94 would be seen through the transparent walls 30, 38 of the first and second compartments, it has been omitted from the cross sectional views (FIGS. 4 and 5) for clarity. If the wafer S is to be cleaned, the first wafer transport 68 carries the wafer upward from the wafer entry station 58 to a position in which the upper half of the wafer extends through the scrubber rollers 88. The first wafer transport 68 is capable of passing off the wafer S in this position to wafer spin pins 96 (FIG. 7A) for rotating the wafer, as it is being scrubbed by the rotating rollers 88, about an axis perpendicular to the wafer and extending through its center. The wafer spin pins 96 extend through the rear double wall 32 of the first compartment and the front wall 56 of the third compartment to a rotary actuator mechanism (to be described) for rotation about their longitudinal axes. Front and rear rinse nozzles (designated 97A and 97B, respectively) mounted on brackets (designated 97C and 97D, respectively) spray a rinsing liquid (e.g., deionized water) onto the front and back portions of the wafer above the rollers 88 as the wafer is being scrubbed.

After cleaning by the scrubber rollers 88, the wafer S is passed back to the first wafer transport 68 and carried up to the second wafer transport 70. The rinse nozzles 97A, 97B spray the wafer as it is lifted up by the first wafer transport 68 from between the rollers 88 so that the entire front and rear surfaces of the wafer are rinsed of cleaning solution. The second wafer transport comprises an arm 98 with a generally hook shaped end and five pegs 100 (broadly, "finger means") projecting rearwardly at spaced apart locations on the hook shaped end (FIG. 4). The pegs 100 are offset from the fingers 82 of the first wafer transport arm 80 to facilitate transfer of the wafer S from the first wafer transport 68 to the second wafer transport 70 (FIG. 8A). The second wafer transport arm 98 extends through a vertical slot 102 in the rear double wall 32 of the first compartment and the front wall 56 of the third compartment where it is connected to still other actuating means described hereinafter.

Figure 10:
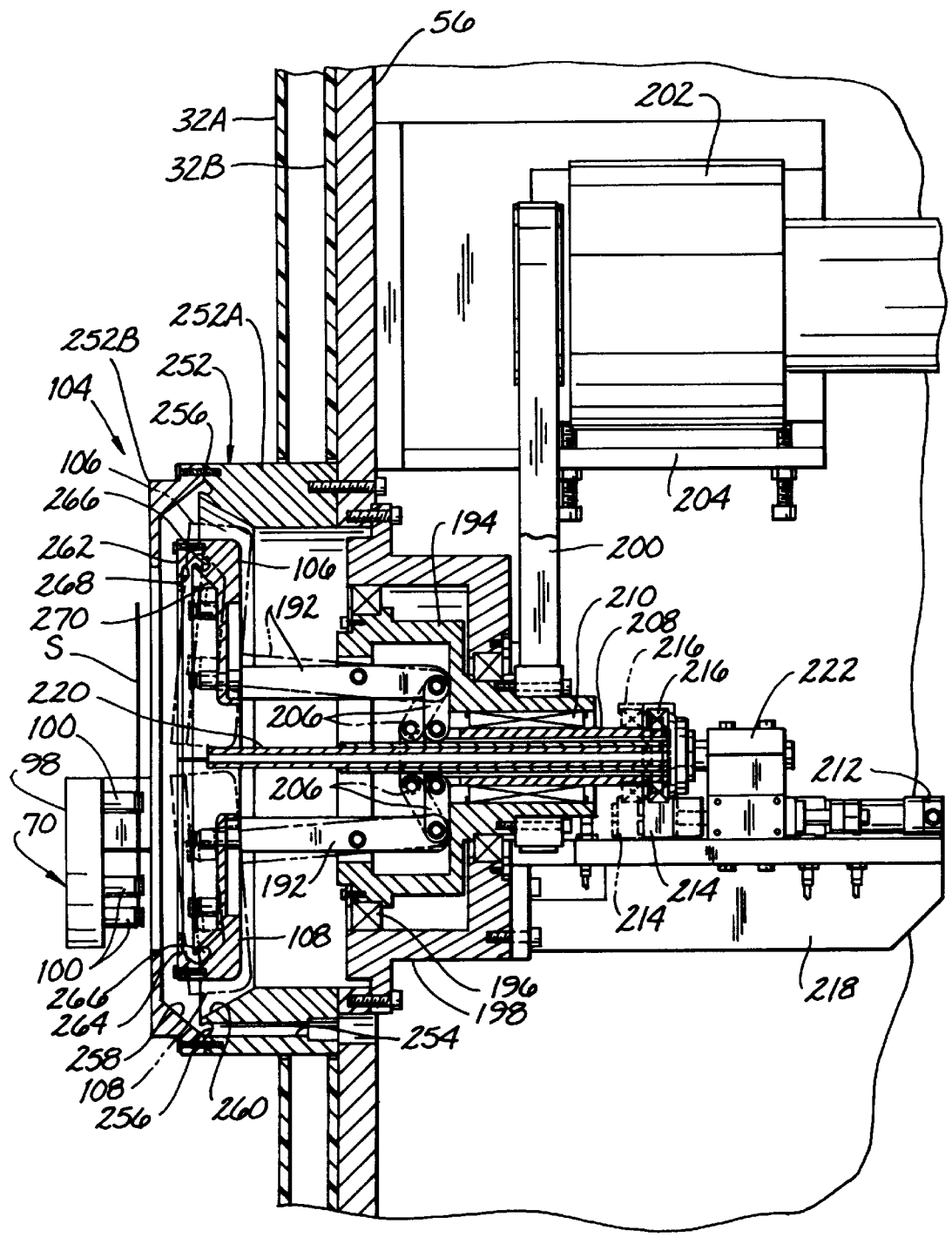
FIG. 10 is an enlarged fragmentary cross sectional view of the apparatus taken in the plane including line 10—10 of FIG. 2 but showing the second wafer transport in registration with the wafer dryer.

The second wafer transport 70 carries the wafer S to a spin dryer, generally indicated at 104, constructed for receiving the wafer from the first wafer transport 68 and holding the wafer in a vertical orientation. The spin dryer 104 has an upper jaw 106 and a lower jaw 108 which can be automatically opened for receiving the wafer S from the second wafer transport 70, and closed to secure the wafer in the dryer. Pegs 110 on the upper and lower jaws 106, 108 engage the wafer S along the peripheral edge margin of the wafer to hold it in the dryer. The pegs 110 are offset from the pegs 100 on the second wafer transport 70 to facilitate the transfer of the wafer (FIG. 10). The upper and lower jaws 106, 108 of the spin dryer 104 are connected through the rear double wall 32 of the first compartment and the front wall 56 of the third compartment to a rotary actuator mechanism described hereinafter for rotating the dryer about an axis passing generally through the center of the wafer held in the dryer. The spin dryer 104 rotates at high speed (preferably in the range of 1,500 to 2,200 rpm) to throw liquid off of the wafer. The spin dryer 104 is relatively massive (e.g., 20 lbs.) relative to the wafer to minimize vibrations during drying.

Figure 11:
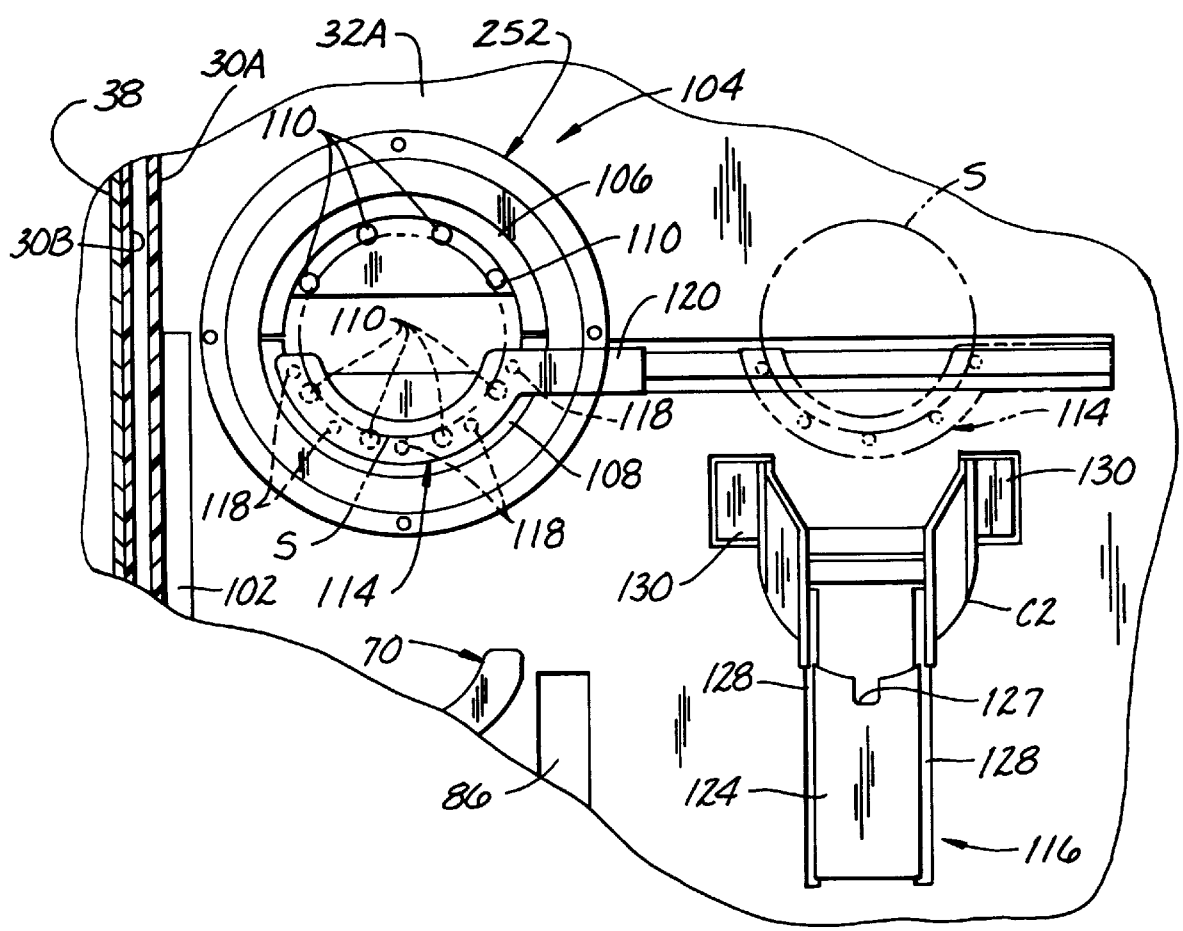
FIG. 11 is an enlarged fragmentary front elevational view illustrating removal of a wafer from the wafer dryer by a take-off wafer transport.

Second wafer transport means of the apparatus capable of transferring the wafer from the spin dryer 104 to a second cassette C2 at a wafer exit station (generally indicated at 112) comprises a wafer take-off transport and a wafer placer (designated generally by reference numerals 114 and 116, respectively). Pegs 118 (broadly, "finger means") on a hook shaped end of an arm 120 of the wafer take-off transport 114 are receivable between pegs 110 on the spin dryer 104 for removing the wafer S from the dryer (FIG. 11). The wafer take-off transport arm 120 extends rearwardly through a pair of parallel, horizontal slots 122 in the rear double wall 32 of the first compartment and the front wall 56 of the third compartment where the arm is connected to an actuating mechanism described hereinafter. The wafer S is moved laterally from the spin dryer 104 by the wafer take-off transport 114 to a position over the wafer exit station 112 (where it is shown in FIG. 2).

Figure 12A:
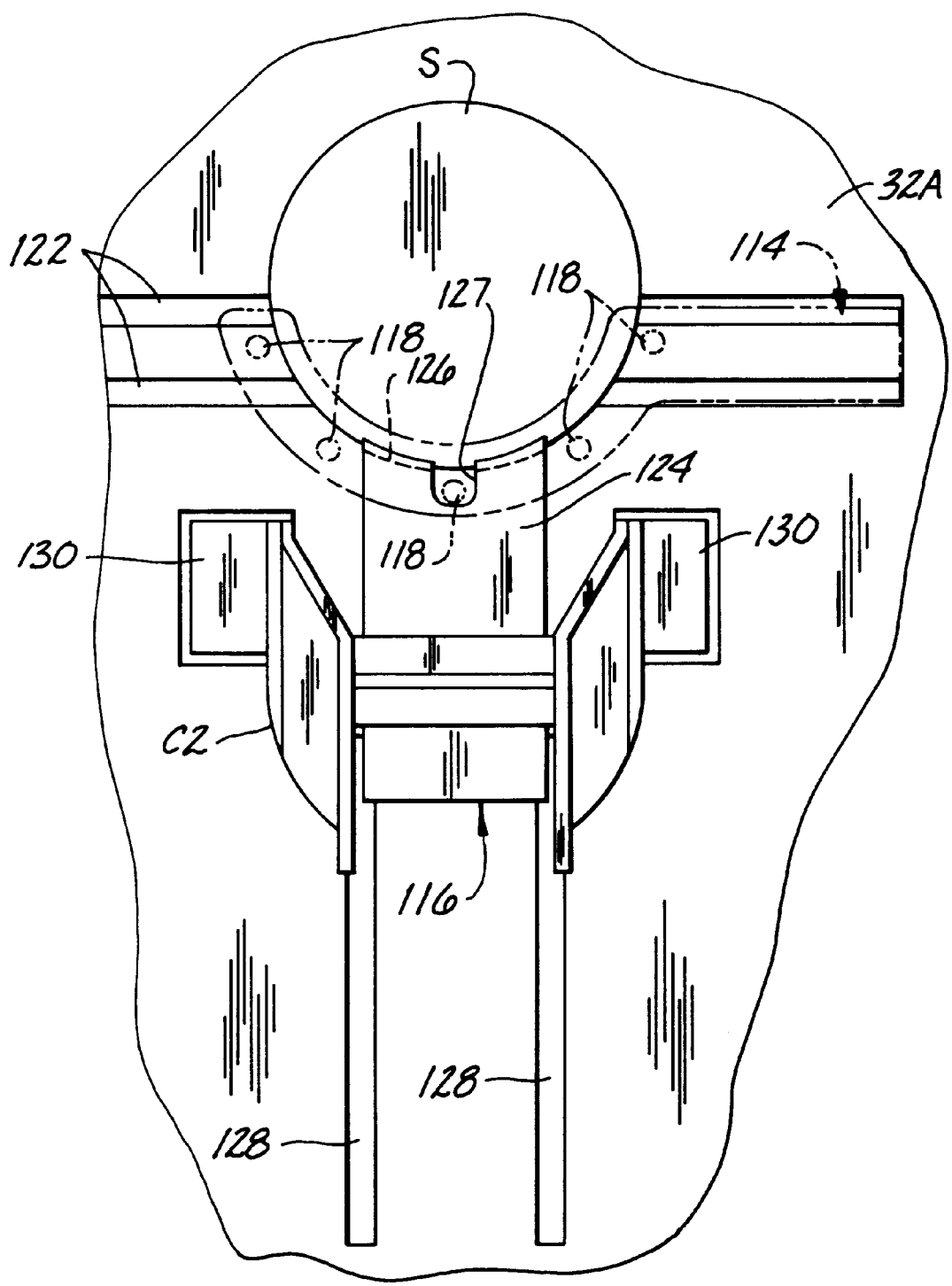
FIG. 12A is an enlarged fragmentary front elevational view taken from FIG. 2 and illustrating transfer of the wafer from the wafer take-off transport to the wafer placer.

As best seen in FIGS. 11 and 12A, the wafer placer 116 comprises an arm 124 having a generally arcuate groove 126 at its upper end sized to receive a lower edge margin of the wafer S. A notch 127 in the center of the upper end of the arm 124 is sized to receive the lower center peg 118 of the wafer take-off transport arm 120 so that the wafer placer arm 124 can lift the wafer off of the pegs 118. The arm 124 is connected through two vertically extending slots 128 to an actuating mechanism described hereinafter. The arm 124 is connected to its associated actuating means at a position below the wafer cassette C2 in the wafer exit station 112 and extends up through the cassette C2 to the wafer take-off transport 114. The wafer placer arm 124 is movable downwardly to deposit the wafer held by its fingers 126 in the cassette. The wafer exit station 112 comprises in the illustrated embodiment a pair of arms 130 which support the wafer cassette C2. As will be described more fully, the wafer exit station arms 130 can be indexed in a front to rear direction (relative to the housing 20) to permit the wafer placer 116 to deposit wafers S next to each other in the exit wafer cassette C2. In another embodiment (not shown) support arms are constructed for supporting the exit wafer cassette C2 from under the cassette. In that event, the wafer placer arm 124 would be movable between the arms and through the open bottom of the exit wafer cassette C2. An advantage of support from the bottom is that wafer cassettes of different configurations are more readily held by the same support arms.

All of the components in the first compartment are preferably made of fluorinated plastics or a suitable non-metallic material to protect wafers in the first compartment from metals contamination. There is minimal contact between the wafer and each component holding the wafer in the first compartment. The means (e.g., electric motors, cylinders and lead screws) actuating motion of the wafer holding components are disposed in the third compartment. The actuating means, described more fully hereafter, are substantially isolated from the first compartment so that particle generated by the actuating means does not contaminate the wafers. In addition, the wafer entry station 58, scrubber rollers 88 and spin dryer 104 are vertically arranged one above the other. The air flow through the first compartment of the housing 20 is generally vertically downward so that particles are pushed in the opposite direction from the travel of the wafer from the entry station 58 to the spin dryer 104. Moreover, by holding the wafers vertically upright at all locations in the apparatus, only a thin edge is presented perpendicular to the direction of air flow, making it less likely that any particles entrained in the air flow will be deposited on a face of the wafers.

Referring now to FIGS. 3, 4 and 6, actuation of the wafer picker 66 to remove a wafer S from the wafer cassette C1 at the wafer entry station 58 is illustrated. The bracket 76 connects the wafer picker arm 72 to a lead screw 134 mounted on a platform 136 in the third compartment. The lead screw 134 is selectively driven by an electric motor 138 also mounted on the platform 136 and connected to the lead screw by a belt 140. The platform 136 is mounted by four sleeves 142 (only one is shown) on vertically extending rails 144 mounted on the front wall 56 of the third compartment. A pair of cylinders 146 mounted on the front wall 56 are operable to move the platform 136 and hence the wafer picker arm 72 between a lowered position in which the fingers 74 of the wafer picker 66 are below a wafer in the cassette C1 and a raised position in which the fingers are located above the cassette. A resilient positioning stop (not shown) is engageable with the platform 136 in the raised position to precisely locate the platform. In operation, the platform 136 is dropped by action of the cylinders 146 so that the wafer picker fingers 72 are below the bottom the cassette C1 at the rear end of the cassette. The motor 138 is energized to turn the lead screw 134 for moving the wafer picker arm 72 forward under the next wafer in the cassette C1. The cylinders 146 are then re-activated to lift the wafer S up out of the cassette. A sensor (not shown) such as a photoelectric eye is positioned to detect whether a wafer has been successfully removed from the cassette C1 by the wafer picker 66.

The first wafer transport arm 80 is connected in the third compartment by the bar 84 to a slide 148 on a vertically oriented lead screw 150 mounted on the front wall 56 of the third compartment. The lead screw 150 is connected by a belt 152 to an electric motor mounted 154 on the front wall 56 operable to drive the lead screw for moving the first wafer transport arm 80 to selected locations along the length of the slot 86. If the wafer S is to be cleaned by the wafer scrubber rollers 88 the first wafer transport 68 stops at a position in which the upper portion of the wafer extends between the scrubber rollers and the lower edge margin is just above the wafer spin pins 96. This position is illustrated in phantom in FIG. 7 of the drawings.

Referring now to FIGS. 3, 4, 7 and 7A, the wafer spin pins 96 extend through the rear double wall 32 of the first compartment, the front wall 56 of the third compartment and a pair of spaced apart stands 156 (FIG. 4) in which they are mounted for rotation about their longitudinal axes. At their rear ends (FIG. 3), the spin pins 96 have pulleys 158 affixed to them which receive a belt 160 connecting the pins to an electric motor 162 capable of selectively driving the rotation of the pins. The motor 162 is attached by way of a motor mount 164 to the rear of the two stands 156. The stands 156 are fixed to a plate 166 connected by slides 168 to a pair of rails 170 for motion in a front to rear direction relative to the housing 20. An air cylinder 172 connected to the plate 166 actuates the movement of the plate between an extended position (shown in phantom in FIG. 7), and a retracted position (shown in solid lines in FIG. 7). A stop (not shown) precisely positions the plate in the extended position. The rails 170 are connected to a platform 174 mounted on the front wall 56 of the third compartment which also mounts the arms 62 of the wafer entry station 58 (FIG. 4).

Figure 7A:
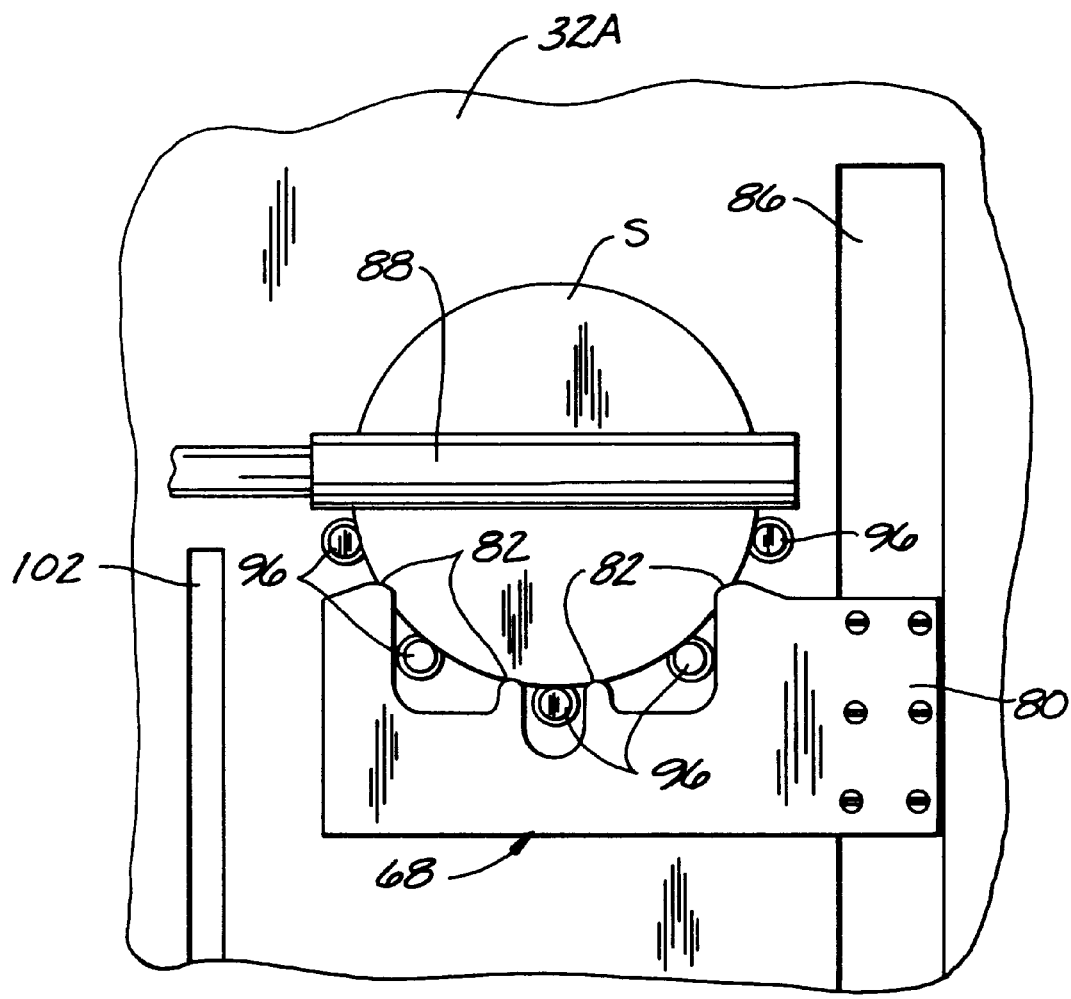
FIG. 7A is an enlarged fragmentary front elevational view taken from FIG. 2 and illustrating transfer of the wafer from the first wafer transport to wafer spin pins associated with the wafer scrubber.

If the wafers are to be cleaned using the scrubber rollers 88, the first wafer transport 68 carries the wafer from just above the wafer entry station 58 (shown in solid lines in FIG. 7), to a position in which about the upper half of the wafer extends between the scrubber rollers (shown in phantom in FIG. 7). The air cylinder 172 is then activated to move the spin pins 96 from the retracted position to the extended position. The fingers 82 of the first wafer transport 68 and the spin pins 96 are offset so that grooves 176 on the ends of the spin pins underlie the lower peripheral edge of the wafer. The first wafer transport arm 80 is then lowered to set the wafer S in a vertically upright position in the grooves 176 of the spin pins 96, as is shown in FIG. 7A. The motor 162 is energized to rotate the wafer S about its center at the same time the wafer is scrubbed by the scrubber rollers 88. After scrubbing, the hand-off procedure is reversed. The first wafer transport arm 80 is moved upward to lift the wafer off of the spin pins 96, which are then retracted by action of the cylinder 172.

Figure 8:
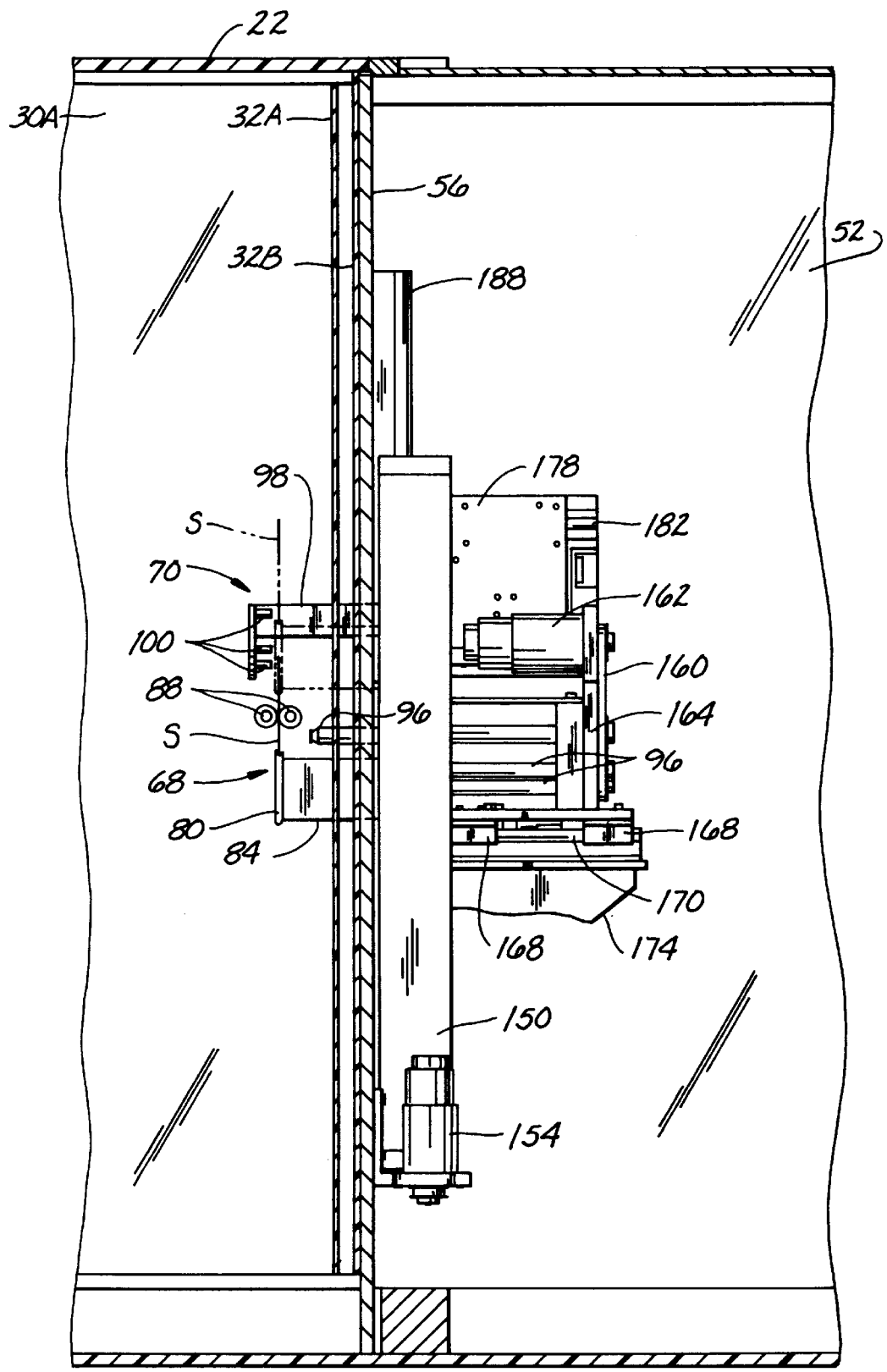
FIG. 8 is a cross sectional view of the apparatus similar to FIG. 7 but with the wafer entry station removed and a second wafer transport of the apparatus additionally illustrated.
Figure 8A:
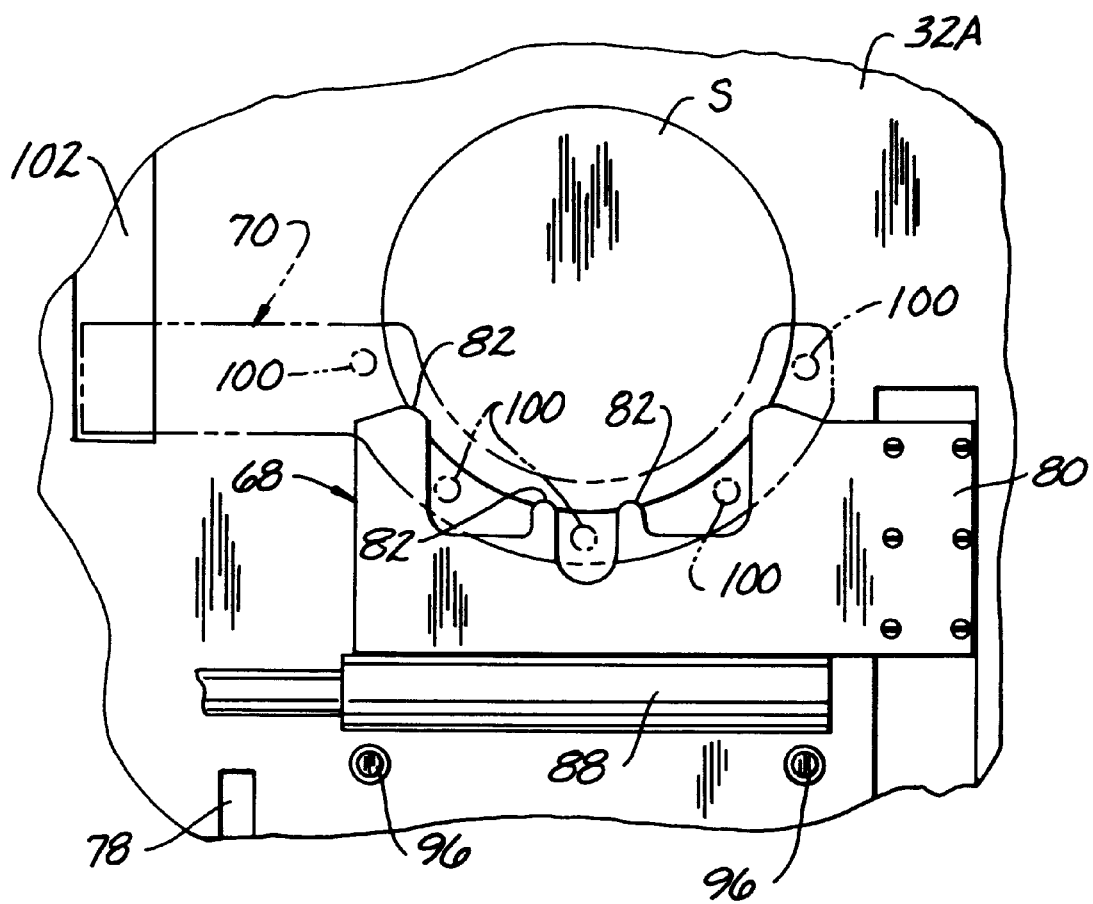
FIG. 8A is an enlarged fragmentary front elevational view taken from FIG. 2 and illustrating transfer of the wafer from the first wafer transport to the second wafer transport.

Referring now to FIGS. 3, 4, 8 and 8A, the motor 154 is energized to drive the first wafer transport arm 80 upward through the scrubber rollers 88 to a position behind the second wafer transport 70 (shown in phantom in FIG. 8). The second wafer transport arm 98 is mounted in the third compartment to a vertically oriented first plate 178 attached by slides 180 to a pair of rails 182 mounted on a second plate 184 fixed to a third plate 185. A first air cylinder 186 connected to the first plate 178 and the third plate 185 is operable to move the first plate and the second wafer transport arm 98 relative to the second plate 184 and third plate between extended and retracted positions. The third plate 185 is connected by slides 187 (FIG. 4, only two are shown) on two rails 188 mounted on the front wall 56 of the third compartment. A second air cylinder 190 mounted at one end on the front wall 56 and at an opposite end to the third plate 185 is operable to conjointly move the first, second and third plates 178, 184, 185, and the second wafer transport arm 98, between a lowered position and a raised position.

Just prior to receiving a wafer for transport to the spin dryer 104, the second wafer transport arm 98 is in its lower and forward position to permit the first wafer transport arm 80 to move into registration with the second wafer transport arm as shown in FIGS. 8 and 8A. The first air cylinder 186 is then activated to move the second wafer transport arm 98 rearwardly so that the distal ends of the pegs 100 extend between the fingers 82 of the first wafer transport arm 80 and underlie a lower edge of the wafer S. The rearward or retracted position of the second wafer transport arm is precisely controlled by a positioning stop 191A (FIG. 9) engageable with a projection (not shown) from the plate 178. The first wafer transport 68 is then lowered to set the wafer S onto the pegs 100 in a vertically upright position (FIG. 8A), and continues downward back to a position for receiving another wafer from the wafer picker 66 in the manner previously described. The first air cylinder 186 is reactivated to move the second wafer transport arm 98 back to its forward position. As illustrated in FIG. 9, the second air cylinder 190 is then activated to move the second wafer transport arm 98 to its raised position, in registration with the spin dryer 104. A positioning stop 191B (FIG. 3) is engageable with the plate 185 to precisely position the second wafer transport arm 98 with respect to the spin dryer 104.

Referring now to FIGS. 3 and 10, the upper and lower jaws 106, 108 of the wafer spin dryer 104 are pivotally mounted by respective rocker arms 192 on the inside diameter of a hollow, open ended rotor 194 mounted an annular bearing 196 for rotation on a spin dryer fixture 198 attached to the front wall 56 of the third compartment. The rotor 194 is connected by a belt 200 to an electric motor 202 mounted on a bracket 204 above the spin dryer 104 and capable of rotating the rotor and connected jaws 106, 108. The rear ends of the rocker arms 192 are pivotally connected by links 206 to an actuator tube 208 coaxial with the rotor 194 and received through a bearing 210 in the rear end of the rotor. The actuator tube 208 rotates conjointly with the rotor 194. A pair of air cylinders 212 are joined to the actuator tube 208 by a connector 214 attached to a bearing 216 mounting the rear end of the actuator tube for rotation relative to the cylinders, but fixing the actuator tube for conjoint linear motion with the cylinders. The cylinders 212 are supported by a platform 218 mounted on the fixture 198. The upper and lower jaws 106, 108 of the spin dryer 104 are shown in their closed position in solid lines in FIG. 10. The links 206, rocker arms 192 and jaws 106, 108 are shown in their open position in phantom in FIG. 10. Thus, it may be seen that when the actuator tube 208 is moved forward by the cylinders 212, the links 206 pull the rocker arms 192 so that they swing the jaws to the open position.

The first air cylinder 186 of the second wafer transport 70 is activated to bring the wafer S into the open upper and lower jaws 106, 108 of the spin dryer 104. A positioning stop 213 is engageable with the plate 178 so that the wafer is precisely located with respect to the pegs 110 of the wafer dryer 104. Upon closure of the jaws the pegs 110 on the lower jaw 108 lift the wafer off of the second wafer transport arm 98, and the first cylinder 186 is reactivated to move the arm forwardly out of the spin dryer 104. The wafer S is then held in a vertical orientation only along its upper and lower edge margins by the pegs 110 of the jaws.

If the wafer S is scrubbed by the scrubber rollers 88, it will be rinsed with deionized water after mounting in the spin dryer 104. The back side of the wafer is rinsed by water from a rinse tube 220 coaxially mounted with the actuator tube 208 and connected at its rear end to a fluid coupling 222 mounted on the platform 218. The rinse tube 220 is fixed relative to the actuator tube 208 and is capable of supplying a spray of water to the back face of the wafer held in the jaws 106, 108.

Figure 14:
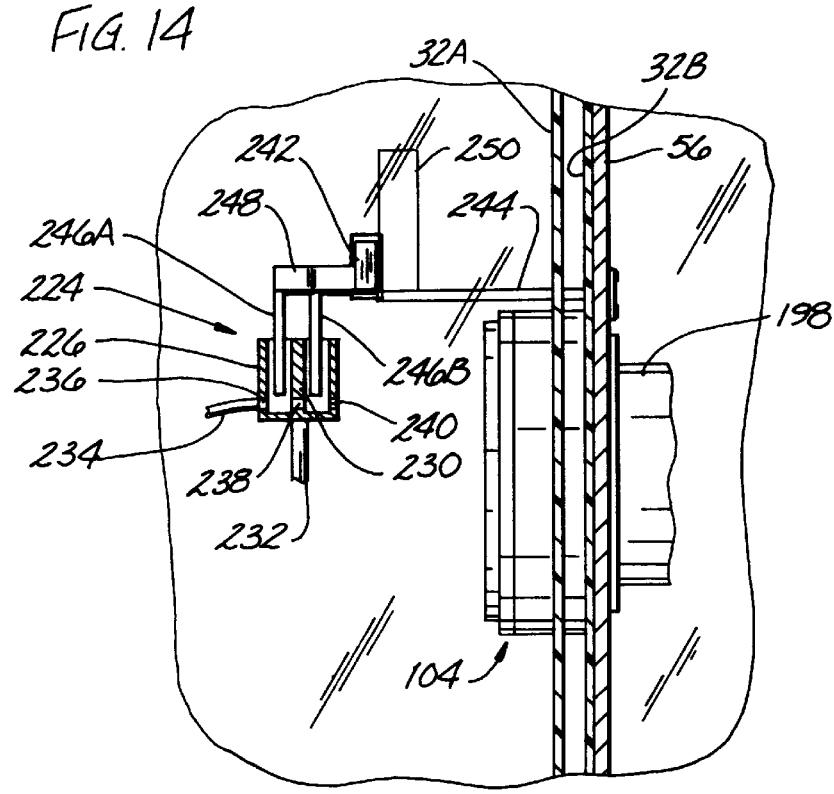
FIG. 14 is an enlarged, fragmentary cross sectional view similar to FIG. 9 showing a wafer rinsing device.
Figure 15:
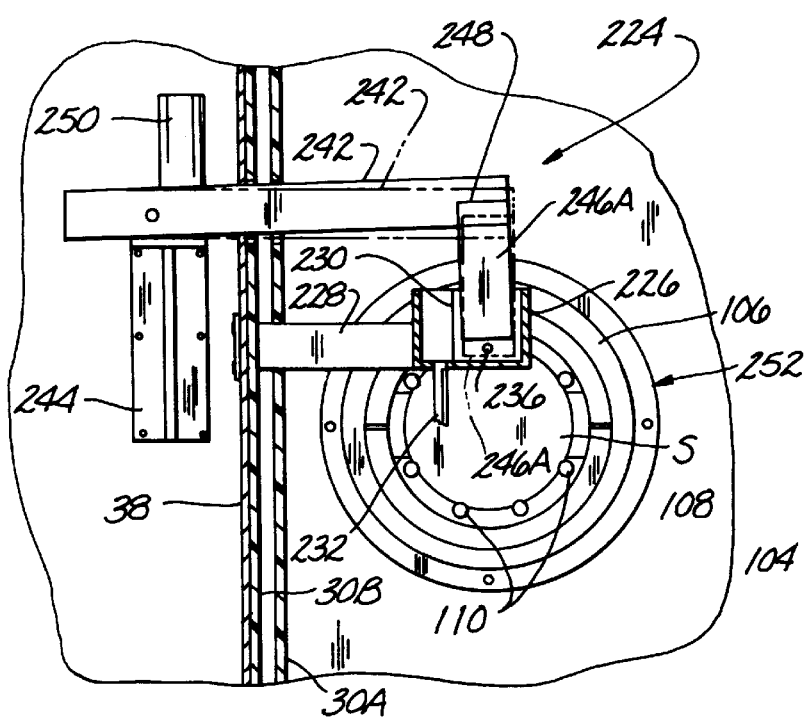
FIG. 15 is an enlarged, fragmentary front elevational view similar to FIG. 2 and showing the wafer rinsing device.

Referring now to FIGS. 14 and 15, the front side of the wafer is rinsed by operation of a rinsing device indicated generally at 224. The rinsing device includes a splash box 226 cantilevered by a beam 228 on the right side wall 38 of the second compartment and extending through the left side double wall 30 of the first compartment. The splash box 226 is located in front of the spin dryer 104 near the top of the dryer, and includes a partial interior wall 230 defining two interior compartments opening to a third interior compartment having a drain 232. A water line 234 connected in an opening 236 on a side of the box 226 opposite the spin dryer 104 is capable of delivering a stream of deionized water through a first of the two interior compartments defined by the partial wall 230. The water stream passes through an opening 238 in the partial wall 238, and across a second of the two interior compartments. The water stream leaves the box 226 through an opening 240 in the opposite side of the splash box and impinges upon the wafer.

A deflector arm 242 is pivotally mounted in the second compartment by a bracket 244 connected through the back wall 42 of the second compartment on the aluminum front wall 56 of the third compartment. The arm 244 extends through right sidewall 38 of the second compartment, the left side double wall 30 and into the first compartment. A pair of deflector shields (designated 246A and 246B, respectively) depend from a member 248 at the free end of the deflector arm 244 into respective first and second compartments of the splash box 226. The deflector arm 242 is connected to a pneumatic cylinder 250 in the second compartment which actuates pivoting motion between a lower position shown in phantom in FIG. 15, in which the deflector shields 246A, 246B are interposed in the path of the water stream so that all of the water is deflected into the third compartment and out the drain 232, and a raised position shown in solid lines in FIG. 15, in which the water stream is free to pass through the openings 234, 236, 238 in the splash box 226 and onto the wafer S. The deionized water stream is delivered continuously from the water line 234, and rinsing is controlled solely by the position of the deflector shields 246A, 246B. It has been found that if only a single shield and single compartment in the splash box (not shown) is used that water may migrate around the single deflector shield and out of the splash box onto the wafer. However, it is to be understood that a single compartment box and single deflector shield, or multiple compartments and deflector shields may be used without departing from the scope of the present invention. The rinse device 226 of the preferred embodiment may be selectively turned on and off without the use of solenoids and valves which can introduce contaminants to the water. In practice, the rinse device 226 and rinse tube 220 are controlled to spray water onto opposite faces of the wafer S held in the spin dryer 104 at the same time. For instance, the rinse cycle may constitute about five seconds during the spin dryer 104 is accelerating up to its drying speed.

To dry the wafer, the electric motor 138 is energized to rotate the jaws 106, 108 at speeds between 1,500 and 2,200 rpm which causes liquid on the wafer to be thrown off of the wafer. The jaws 106, 108 are relatively massive as compared to the wafer (e.g., the jaws weigh 20 pounds in the preferred embodiment) so that there will be substantially no vibrations as the jaws rotate. An annular outer shield (generally indicated at 252) surrounding the jaws 106, 108 in the first compartment is mounted on the front wall 56 of the third compartment and extends forwardly through the double rear wall 32 into the first compartment. The outer shield 252 includes a base 252A and an annular rim 252B connected to the base, which catch the liquid thrown radially out from the wafer and guide it to a drain 254. The outer shield 252 is constructed to prevent liquid from dripping back down onto the wafer S after it is thrown off. More specifically, the base 252A has an annular channel 256 in its forward face which curves radially inwardly. The rim has a angled surface 258 which guides liquid thrown from the wafer into the channel 256. A surface 260 of the base 252A radially inwardly of the channel 256 flares outwardly to guide liquid toward the channel. The radially inward extension of the channel 256 permits the channel to retain liquid guided into it by the rim 252B, rather than dripping back down onto the jaws 106, 108 and the wafer. Instead, the liquid travels downwardly in the channel 256 where it passes into the drain 254.

The upper and lower jaws 106, 108 are similarly constructed to prevent liquid from dripping back down onto the wafer S. The upper and lower jaws each include a semi-annular rim (designated 262 and 264) connected to the jaws. A semi-annular channel 266 in each of the jaws 106, 108 adjacent to the rims 262, 264 curves radially inwardly, in the same fashion as the channel 256 in the outer shield 252. In the closed position of the jaws, the semi-annular rims 262, 264 and semi-annular channels 266 cooperate to form substantially continuous annular structures. Inner surfaces 268 of the rims 262, 264 are angled outward toward the channels 266, and surfaces 270 on the jaws 106, 108 radially inward of the channels flare outwardly so that water thrown off of the wafer S is guided toward the inner surfaces. The radially inward extension of the channels 266 retains liquid in the channels rather than permitting liquid to drip off of the jaws 106, 108 back onto the wafer S. After rotation of the jaws 106, 108 is stopped, the liquid in the channels 266 flows out of the jaws through gaps (not shown) between the jaws 106, 108 and their respective rims 262, 264 to the outer shield 252 and on to the drain 254.

Figure 5:
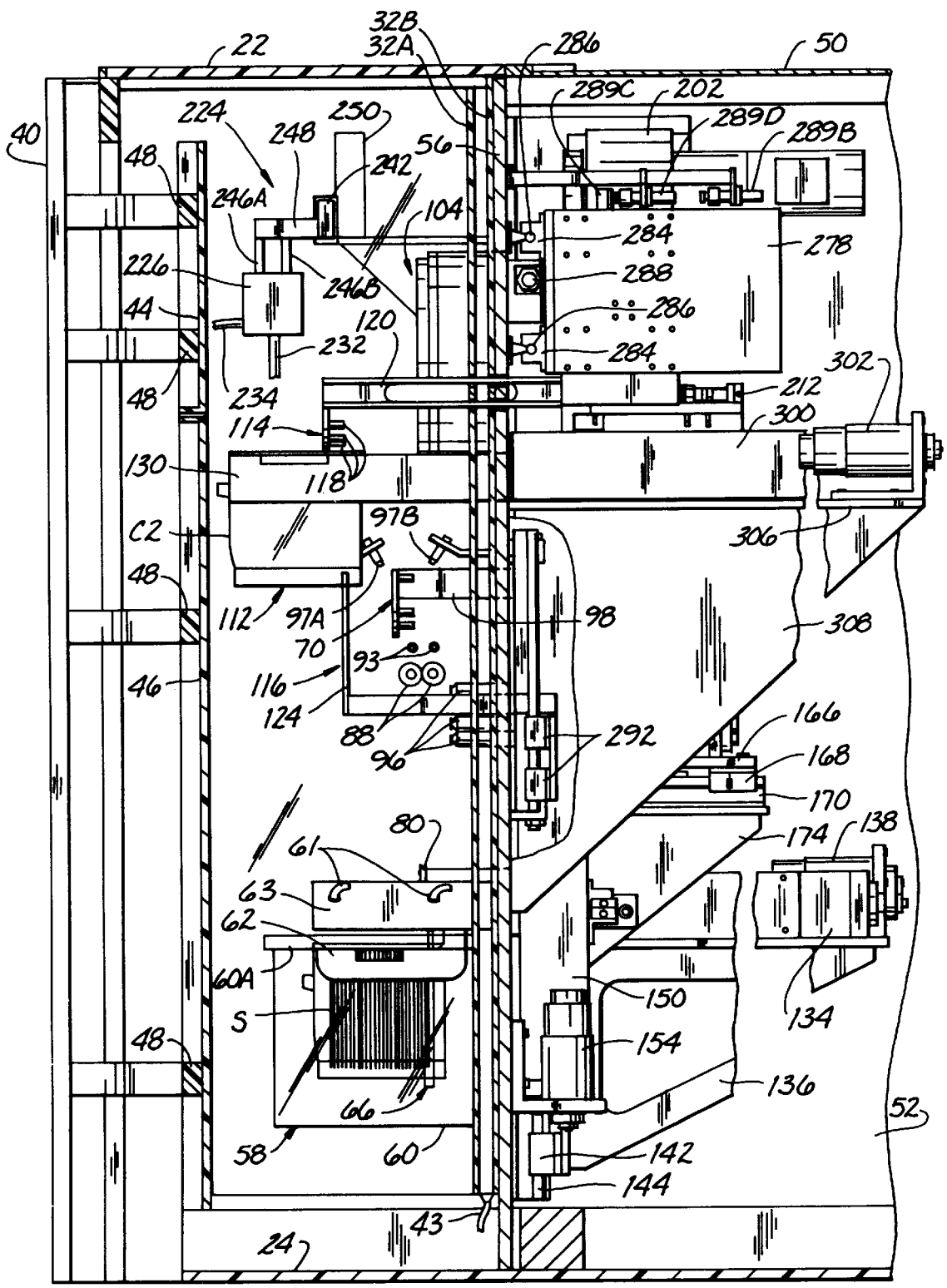
FIG. 5 is an enlarged fragmentary cross sectional view of the apparatus taken in the plane including line 5—5 of FIG. 1.

The wafer take-off transport 114 has substantially the same construction as the second wafer transport 70, except that the wafer take-off transport arm 120 is mounted for horizontal motion laterally of the housing. Referring now to FIGS. 3, 5 and 11, the wafer take-off transport arm 120 extends through the slots 122 and is connected to a first plate 272 attached by slides 274 to a pair of rails 276 mounted on a second plate 278 parallel to the first plate. The second plate 278 is fixedly connected to a third plate 280 oriented generally perpendicular to the first plate 272 and the second plate. A first air cylinder 282 connected to the first plate 272 and the third plate 280 is operable to move the first plate and wafer take-off transport arm 120 relative to the second plate 278 between two horizontal positions. The third plate 280 is connected by four slides 284 (FIG. 5, only two are shown) on two horizontally extending rails 286 mounted on the front wall 56 of the third compartment.

A second air cylinder 288 mounted on the front wall 56 and on to the third plate 280 is operable to conjointly move the first, second and third plates and wafer take-off transport arm 120 between a position in horizontal registration with the spin dryer 104 and a position in generally above the wafer placer 116. A pair of positioning stops 283 (FIG. 3, only one is shown) engageable with a projection (not shown) of third plate 280 to precisely locate the wafer take-off transport arm 120 in the two horizontal positions. The first air cylinder 282 is operable, when the wafer take-off transport arm 120 is in registration with the spin dryer 104, to move the arm rearwardly into the spin dryer. A positioning stop 289B is engageable with a projection 289C of the plate 272 to precisely locate the wafer take-off transport arm 120 within the wafer dryer 104. The upper and lower jaws 106, 108 are then opened to set the wafer on the pegs 118 of the wafer take-off transport arm 120, and the first air cylinder 282 activated to move the arm forwardly out of the spin dryer 104. The wafer take-off transport arm 120 is moved laterally to its position above the wafer placer 116 by reactivating the second cylinder 288. Air cylinder 282 is reactivated to move the wafer take-off transport arm 120 rearwardly until the projection 289C of plate 272 engages position stop 289D which precisely locates the wafer S with respect to the wafer placer arm 124.

Referring to FIGS. 3, 5 and 11–13, the wafer placer arm 124 extends rearwardly and splits into two parts, each passing through a respective one of the two vertical slots 128 in the rear double wall 32 of the first compartment and the front wall 56 of the third compartment. Both parts of the arm 124 are attached to a plate 290 in the third compartment which is connected by four slides 292 (FIG. 5, only two are shown) to a pair of vertically oriented rails 294 mounted on the front wall 56. An air cylinder 296 mounted at its upper end on the front wall 56 is attached at its lower end to the plate 290 for actuating movement of the plate and wafer placer arm 124 between raised and lowered positions. After the wafer take-off transport arm 120 is moved to its position over the wafer placer 116, the air cylinder 296 is activated to raise the wafer placer arm up through the open bottom and open top of the cassette C2. A positioning stop 297 engages the plate 290 in its raised position to precisely locate the wafer placer arm 124. The notch 127 receives the lower center peg 118 of the wafer take-off transport arm 120 so that the upper end of the wafer placer arm 124 passes above the pegs (FIG. 12A). The wafer S is lifted off of the pegs 118 and is supported by the wafer placer 116 in the groove 126 of the wafer placer arm 124. The first air cylinder 282 of the wafer take-off transport is re-activated to move the wafer take-off transport arm 120 forward to a third horizontal position. The wafer S is now clear to be placed in the cassette C2 at the wafer exit station 112.

The support arms 130 of the wafer exit station 112 extend through holes in the rear double wall 32 of the first compartment and in the front wall 56 of the third compartment are joined to a common slide 298 connected to a lead screw 300. The lead screw 300 is driven by an electric motor 302 connected to the lead screw by a belt 304 for moving the arms 130 and wafer cassette C2 carried thereby for placement of each wafer in an adjacent slot of the cassette. The lead screw 300 and motor 302 are mounted on a plate 306 connected to the front wall 56 of the third compartment by a brace 308. In its raised position, the wafer placer arm 124 extends through the wafer cassette C2 in registration with one of the slots in the cassette. After the wafer placer arm 124 receives the wafer, the air cylinder 296 is activated to move the wafer placer arm to its lowered position, thereby setting the wafer in the slot. The motor 302 is energized to index the wafer cassette C2 so that the next empty slot in the cassette is aligned with the wafer placer arm 124. The wafer cassette C2 is thus positioned for placement of the next dried wafer in the slot adjacent to that in which the preceding wafer was placed. It will be noted that the wafers are placed in the exit wafer cassette C2 in the same order as they were arranged in the entry wafer cassette. Thus, the identity of each wafer is maintained after cleaning and drying.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. Apparatus for use in automatically cleaning semiconductor wafers, the apparatus comprising:

a wafer entry station for receiving multiple wafers held in a vertical orientation;

first wafer transfer means for transferring one wafer at a time from the wafer entry station without changing the vertical orientation of said one wafer;

a spin dryer constructed for receiving said one wafer from said first wafer transfer means and holding said one wafer in a vertical orientation, the spin dryer being rotatable about an axis passing generally through the center of said one wafer received from said first wafer transfer means at a rate of rotation selected to throw liquid on said one wafer off of the wafer;

second wafer transfer means for transferring said one wafer from the spin dryer in a vertical orientation;

a wafer exit station for receiving said one wafer from said second wafer transfer means in a vertical orientation.

2. Apparatus as set forth in claim 1 wherein said first and second wafer transfer means are constructed for holding said one wafer solely along a lower edge margin of said one wafer.

3. Apparatus as set forth in claim 2 wherein said first wafer transfer means comprises a wafer picker including an arm and finger means on an end of the arm, the wafer picker being movable generally vertically downwardly to position said finger means at a level below the wafers in the wafer entry station, movable generally horizontally to position said finger means under said lower edge margin of said one wafer and movable vertically upwardly to lift said one wafer out of the wafer entry station.

4. Apparatus as set forth in claim 3 wherein said first wafer transfer means further comprises first and second wafer transports for receiving said one wafer from the wafer picker and transporting the wafer to the spin dryer, the first wafer transport comprising an arm and finger means on the arm, the first wafer transport and wafer picker being relatively movable to position said finger means of the first wafer transport under said finger means of the wafer picker, said finger means of the first wafer transport being offset from said finger means of the wafer picker whereby upon relative vertical movement between the wafer picker and first wafer transport said one wafer is transferred to said finger means of the wafer transport, said second wafer transport comprising an arm and finger means on the arm, the first and second wafer transports being relatively movable to position said finger means of the second wafer transport under said finger means of the first wafer transport where upon relative vertical movement between the first and second wafer transports said one wafer is transferred to said finger means of the second wafer transport.

5. Apparatus as set forth in claim 4 wherein the spin dryer comprises first and second jaws and a plurality of pegs connected to the first and second jaws, the jaws being pivotable between an open position and a closed position in which the pegs are adapted to grip said one wafer and hold said one wafer for spinning, the second wafer transport being movable to bring said one wafer into the jaws in their open position, said finger means of the second wafer transport being offset from the pegs to permit the pegs to move past said finger means to the closed position for gripping said one wafer.

6. Apparatus as set forth in claim 5 wherein said second wafer transfer means comprises a wafer take-off transport for taking said one wafer out of the spin dryer, the wafer take-off transport comprising an arm and finger means on the arm, the wafer take-off transport and spin dryer being relatively movable to position said finger means of the wafer take-off transport under the pegs of the spin dryer in the closed position, said finger means of the wafer take-off transport being offset from the pegs of the spin dryer whereby upon movement of the jaws to the open position said one wafer is transferred to said finger means of the wafer take-off transport.

7. Apparatus as set forth in claim 6 wherein said second wafer transfer means further comprises a wafer placer including an arm and finger means on an end of the arm, the wafer take-off transport and wafer placer being relatively movable to position said finger means of the wafer take-off transport under said finger means of the wafer placer, said finger means of the wafer take-off transport being offset from said finger means of the wafer placer whereby upon relative vertical movement between the wafer placer and wafer take-off transport said one wafer is transferred to said finger means of the wafer placer, the wafer placer being movable generally vertically downwardly to deposit said one wafer in the wafer exit station.

8. Apparatus as set forth in claim 1 wherein the spin dryer is located above the wafer entry station.

9. Apparatus as set forth in claim 8 further comprising opposing wafer scrubber rollers located between the wafer entry station and the spin dryer for scrubbing said one wafer, the wafer scrubber rollers being located above the wafer entry station and the spin dryer being located above the wafer scrubber rollers.

10. Apparatus as set forth in claim 9 further comprising wafer spin pins disposed generally below the scrubbing rollers for holding said one wafer and rotating the wafer as it is engaged by the scrubbing rollers, the wafer spin pins being constructed for holding said one wafer in a vertically upright position by engagement only along its peripheral edge margin.

11. Apparatus as set forth in claim 9 further comprising a wafer rinsing device for rinsing the wafer, the rinsing device comprising a spray nozzle adapted to continuously deliver a stream of rinsing liquid in a direction to engage a face of the wafer, and a deflector for deflecting the stream of water away from the wafer.

12. Apparatus as set forth in claim 11 wherein the deflector comprises a splash box having first and second compartments separated by a wall, a plurality of substantially aligned openings, the spray nozzle being constructed for delivering said stream of rinsing liquid through the aligned openings, and deflector shields mounted for being selectively interposed in the stream of rinsing liquid to deflect the liquid from the wafer.

13. Apparatus as set forth in claim 8 wherein the spin dryer comprises first and second jaws and a plurality of pegs connected to the first and second jaws, the jaws being pivotable between an open position and a closed position in which the pegs are adapted to grip said one wafer and hold said one wafer for spinning.

14. Apparatus as set forth in claim 13 wherein the jaws are constructed to surround the wafer in the closed position of the jaws, each jaw having an arcuate channel which is curved in cross section and includes a radially inwardly extending portion to capture liquid thrown off of the wafer and prevent liquid from dripping back onto the wafer.

15. Apparatus as set forth in claim 14 further comprising an annular outer splash shield surrounding the jaws, the splash shield having an annular channel which is curved in cross section and includes a radially inwardly extending portion to capture liquid and prevent liquid from dripping back onto the wafer.

16. Apparatus as set forth in claim 1 wherein the spin dryer comprises first and second jaws and a plurality of pegs connected to the first and second jaws, the jaws being pivotable between an open position and a closed position in which the pegs are adapted to grip said one wafer and hold said one wafer for spinning.

17. Apparatus as set forth in claim 16 wherein the jaws are constructed to surround the wafer in the closed position of the jaws, each jaw having an arcuate channel which is curved in cross section and includes a radially inwardly extending portion to capture liquid thrown off of the wafer and prevent liquid from dripping back onto the wafer.

18. Apparatus as set forth in claim 17 further comprising an annular outer splash shield surrounding the jaws, the splash shield having an annular channel which is curved in cross section and includes a radially inwardly extending portion to capture liquid and prevent liquid from dripping back onto the wafer.

19. Apparatus as set forth in claim 1 further comprising:
- a compartment substantially enclosing a volume to be isolated;
- a wafer entry station for receiving wafers;
- paid first wafer transfer means comprising means for holding wafers and means for actuating movement of said holding means, said holding means being disposed within the compartment and said means for actuating movement of said holding means being disposed outside the housing, said holding means extending through the compartment to connect to said actuating means outside the compartment;
- said second wafer transfer means comprising means for holding wafers and means for actuating movement of said holding means, said holding means being disposed within the compartment and said means for actuating movement of said holding means being disposed outside the compartment, said holding means extending through the compartment to connect to said actuating means outside the compartment.

20. Apparatus as set forth in claim 19 wherein the dryer comprises a wafer holding mechanism located inside the compartment and means for actuating rotation of said wafer holding mechanism located outside of the compartment.

21. Apparatus as set forth in claim 20 wherein the compartment comprises at least one double wall including an inner panel and an outer panel, said holding means of said first and second wafer transfer means extending through the double wall to connect to said actuating means of said first and second wafer transfer means.

22. Apparatus as set forth in claim 21 wherein the inner and outer panels of the double wall are spaced apart, the apparatus further comprising a drain disposed for draining liquid trapped between the inner and outer panels.

23. Apparatus as set forth in claim 21 wherein said holding means of said first and second wafer transfer means is made of non-metallic material.

24. Apparatus as set forth in claim 23 wherein said wafer holding means are made of a fluorinated plastic.

* * * * *

UNITED STATES PATENT AND TRADEMARK OFFICE
CERTIFICATE OF CORRECTION

PATENT NO.   : 5,974,680
DATED        : November 2, 1999
INVENTOR(S)  : Gary L. Anderson, Keith Wilson Page 1 of 1

It is certified that error appears in the above-identified patent and that said Letters Patent is hereby corrected as shown below:

Column 14,
Line 28, "the wafer, the" should read -- said one wafer, the --.
Line 30, "face of the" should read -- face of said one --.
Line 32, "the wafer." should read -- said one wafer. --.
Line 40, "the wafer." should read -- said one wafer .--.
Line 48, "the wafer" should read -- said one wafer --.
Line 51, "the wafer" should read -- said one wafer --.
Line 52, "the wafer" should read -- said one wafer. --.
Line 58, "the wafer." should read -- said one wafer --.
Line 66, "the wafer" should read -- said one wafer --.

Column 15,
Line 2, "the wafer" should read -- said one wafer --.
Line 3, "the wafer." should read -- said one wafer. --.
Line 14, "paid first wafer" should read -- said first wafer --.
Line 19, "the housing," should read -- the compartment, --.

Column 16,
Lines 21-22, "transfer means is" should read -- transfer means are --.
Lines 23-24, "said wafer holding" should read -- said holding --.
Line 24, "means are" should read -- means of said first and second wafer transfer means are --.

Signed and Sealed this

Twenty-first Day of August, 2001

Attest:

NICHOLAS P. GODICI
Attesting Officer
Acting Director of the United States Patent and Trademark Office